(12) United States Patent
Okamoto et al.

(10) Patent No.: US 7,030,763 B2
(45) Date of Patent: *Apr. 18, 2006

(54) METHOD FOR MANUFACTURING ELECTRONIC TAG

(75) Inventors: Michio Okamoto, Machida (JP); Yuichi Morinaga, Fuchu (JP); Yuji Ikeda, Hinode (JP); Takeshi Saito, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 156 days.

This patent is subject to a terminal disclaimer.

(21) Appl. No.: 10/341,382

(22) Filed: Jan. 14, 2003

(65) Prior Publication Data
US 2003/0107486 A1    Jun. 12, 2003

Related U.S. Application Data

(62) Division of application No. 10/256,026, filed on Sep. 27, 2002, now Pat. No. 6,762,682.

(30) Foreign Application Priority Data
Sep. 28, 2001   (JP) .............................. 2001-300841

(51) Int. Cl.
  *G08B 13/14* (2006.01)
(52) U.S. Cl. ..................... 340/572.7; 29/601; 343/767; 343/746; 361/813; 235/492
(58) Field of Classification Search ............. 340/572.7; 343/700 MS, 700 R, 793; 361/913, 629, 361/749, 737; 29/827, 600, 601, 846, 411, 29/206; 438/62, 61; 156/502, 505, 510, 156/504, 512, 159, 64, 60; 283/21; 257/673, 257/666, 678, 734, 532, 787, 528; 235/491
See application file for complete search history.

(56) References Cited

U.S. PATENT DOCUMENTS

| | | | |
|---|---|---|---|
| 5,006,856 A * | 4/1991 | Benge et al. ............ 340/572.3 |
| 5,420,757 A | 5/1995 | Eberhardt et al. .......... 361/813 |
| 5,541,399 A | 7/1996 | de Vall ....................... 235/491 |
| 5,605,768 A * | 2/1997 | Furukawa et al. .......... 428/611 |
| 5,608,417 A | 3/1997 | de Vall ....................... 343/895 |
| 5,729,053 A * | 3/1998 | Orthmann ................... 257/724 |
| 5,734,327 A | 3/1998 | Batterink et al. ........ 340/572.5 |
| 5,786,626 A * | 7/1998 | Brady et al. ................. 257/673 |
| 5,826,328 A * | 10/1998 | Brady et al. ................... 29/827 |
| 5,909,050 A | 6/1999 | Furey et al. ................ 257/531 |
| 5,921,583 A * | 7/1999 | Matsumoto et al. .......... 283/81 |

(Continued)

FOREIGN PATENT DOCUMENTS

JP   10-13296   1/1998

*Primary Examiner*—Benjamin C. Lee
(74) *Attorney, Agent, or Firm*—Miles & Stockbridge P.C.

(57) ABSTRACT

In the event of the shipment of electronic tags from a manufacturer to a customer, a number of the electronic tags required by the customer are adhered to a double-faced adhesive tape and then the double-faced adhesive tape is wound on a reel. Then, this reel is contained in a case and shipped to the customer. The electronic tag is adhered to an article in the following manner. That is, the double-faced adhesive tape is cut to obtain pieces of the electronic tags, and the cover tape on the rear surface of the double-faced adhesive tape is peeled, and then, the electronic tag is adhered to the article by the use of the double-faced adhesive tape.

19 Claims, 35 Drawing Sheets

U.S. PATENT DOCUMENTS

| | | | |
|---|---|---|---|
| 5,955,949 A | 9/1999 | Cocita | 340/572.1 |
| 5,973,600 A | 10/1999 | Mosher, Jr. | 340/572.8 |
| 6,088,230 A | 7/2000 | Finn et al. | 361/737 |
| 6,091,332 A | 7/2000 | Eberhardt et al. | 340/572.1 |
| 6,100,804 A * | 8/2000 | Brady et al. | 340/572.7 |
| 6,133,834 A | 10/2000 | Eberth et al. | 340/572.1 |
| 6,140,146 A * | 10/2000 | Brady et al. | 438/62 |
| 6,160,526 A | 12/2000 | Hirai et al. | 343/895 |
| 6,236,223 B1 * | 5/2001 | Brady et al. | 324/765 |
| 6,237,217 B1 | 5/2001 | Bohn et al. | 29/806 |
| 6,304,220 B1 * | 10/2001 | Herve et al. | 343/700 MS |
| 6,317,094 B1 * | 11/2001 | Wu et al. | 343/767 |
| 6,320,556 B1 * | 11/2001 | Cyman et al. | 343/873 |
| 6,339,400 B1 * | 1/2002 | Flint et al. | 343/702 |
| 6,344,824 B1 | 2/2002 | Takasugi et al. | 343/700 MS |
| 6,400,323 B1 | 6/2002 | Yasukawa et al. | 343/700 MS |
| 6,407,669 B1 | 6/2002 | Brown et al. | 340/572.1 |
| 6,421,013 B1 | 7/2002 | Chung | 343/700 MS |
| 6,424,263 B1 | 7/2002 | Lee et al. | 340/572.7 |
| 6,437,985 B1 | 8/2002 | Blanc et al. | 361/749 |
| 6,798,384 B1 * | 9/2004 | Aikawa et al. | 343/700 MS |
| 6,806,842 B1 * | 10/2004 | King et al. | 343/795 |
| 2003/0160728 A1 * | 8/2003 | Fukushima et al. | 343/702 |
| 2004/0078957 A1 * | 4/2004 | Forster et al. | 29/601 |
| 2004/0212544 A1 * | 10/2004 | Pennaz et al. | 343/795 |

* cited by examiner

METHOD FOR MANUFACTURING ELECTRONIC TAG

CROSS-REFERENCE TO RELATED APPLICATION

This application is a divisional of application Ser. No. 10/256,026 filed Sep. 27, 2002 now U.S. Pat. No. 6,762,682.

TECHNICAL FIELD OF THE INVENTION

The present invention relates to a technique for manufacturing an electronic tag, more particularly, relates to a technique effectively applied to a non-contact type electronic tag provided with a microwave-receiving antenna.

BACKGROUND OF THE INVENTION

A non-contact type electronic tag is designed to store desired data in a memory circuit in a semiconductor chip and to read out the stored data by the use of microwaves.

An example of the non-contact type electronic tag is disclosed in Japanese Patent Laid-Open No. 10-13296. This electronic tag has a structure in which a microwave-receiving antenna is constituted by a lead frame, and a semiconductor chip mounted on the lead frame is sealed with resin.

SUMMARY OF THE INVENTION

An electronic tag stores data in a memory circuit in a semiconductor chip. Therefore, the electronic tag has such an advantage that larger amount of data can be stored therein in comparison to a tag utilizing a bar code. In addition, the data stored in the memory circuit is more difficult to be unfairly manipulated in comparison to that stored in a bar code.

However, the structure of the electronic tag of this kind is more complicated in comparison to that of the tag utilizing a bar code. Therefore, manufacturing cost of the electronic tag is high, and this is one of the factors that prevents the popularization of the electronic tag.

An object of the present invention is to provide a technique capable of realizing a low-cost electronic tag.

The above and other objects and novel characteristics of the present invention will be apparent from the description and the accompanying drawings of this specification.

The typical ones of the inventions disclosed in this application will be briefly described as follows.

The electronic tag according to the present invention is provided with a conductor piece constituting an antenna; a slit formed in a part of the conductor piece and having an end extending to an outer edge of the conductor piece; a semiconductor chip mounted on the conductor piece near the slit; a wire having one end bonded to an electrode of the semiconductor chip and the other end bonded to an area of the conductor piece facing to a semiconductor chip mounting area across the slit; and resin for sealing the semiconductor chip and the wire, wherein a rear surface of the semiconductor chip is electrically connected to the conductor piece.

DESCRIPTION OF THE PREFERRED EMBODIMENTS

Hereinafter, embodiments of the present invention will be described with reference to the accompanying drawings. Note that components having the same function are denoted by the same reference symbols throughout the drawings for describing the embodiment and the repetitive description thereof will be omitted.

(First Embodiment)

Figure 1:
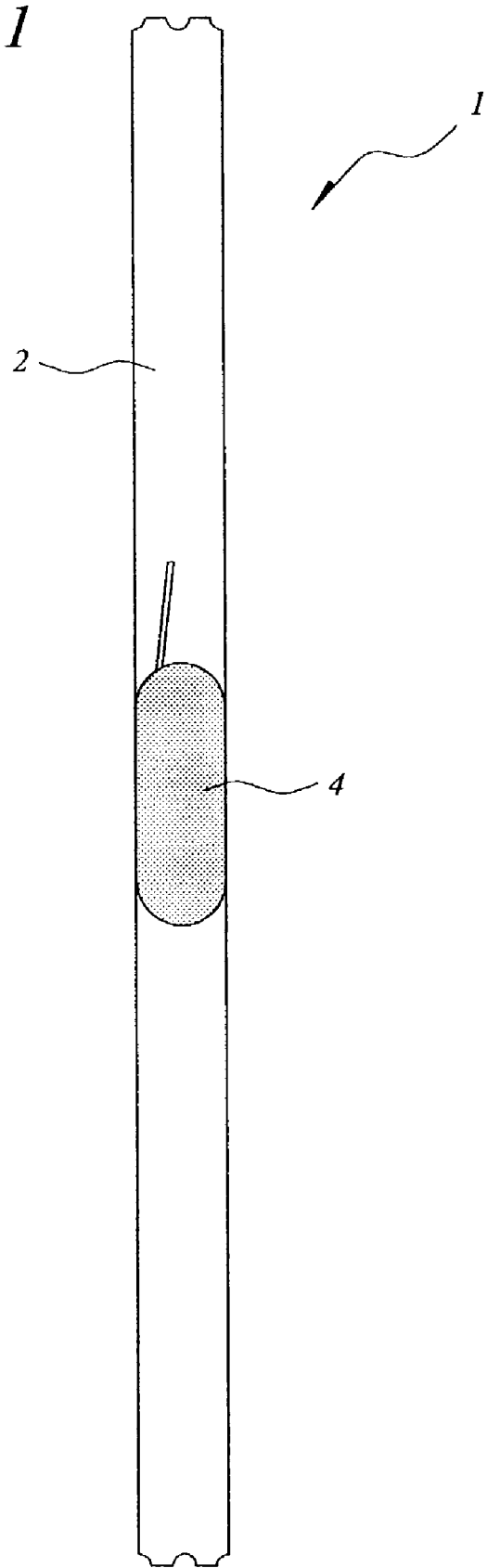
FIG. 1 is a plan view showing an electronic tag according to an embodiment of the present invention.
Figure 2:
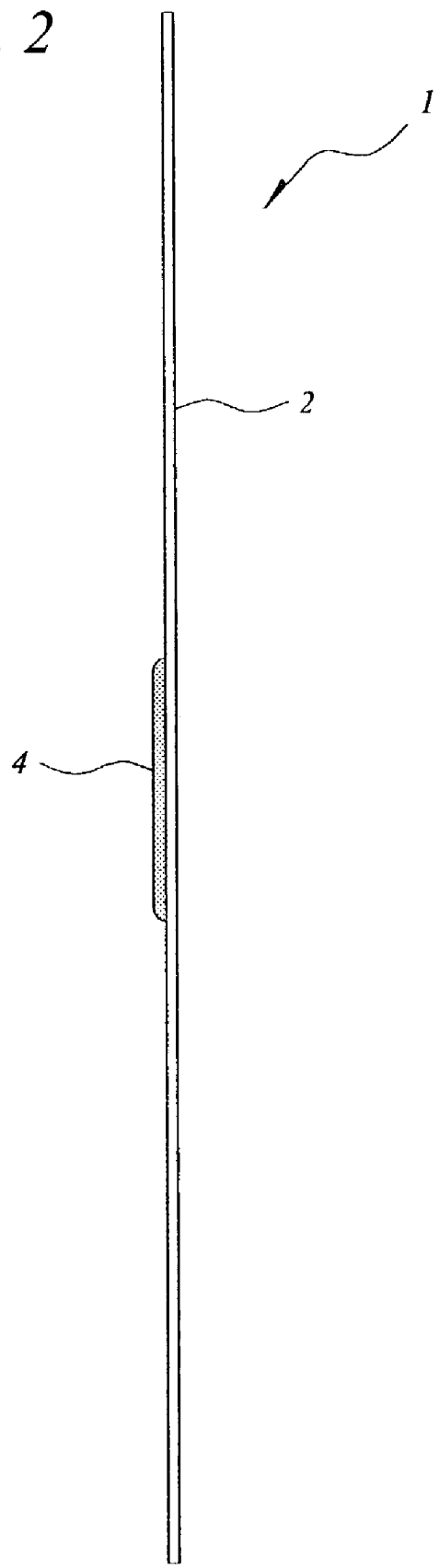
FIG. 2 is a side view showing the electronic tag according to the embodiment of the present invention.
Figure 3:
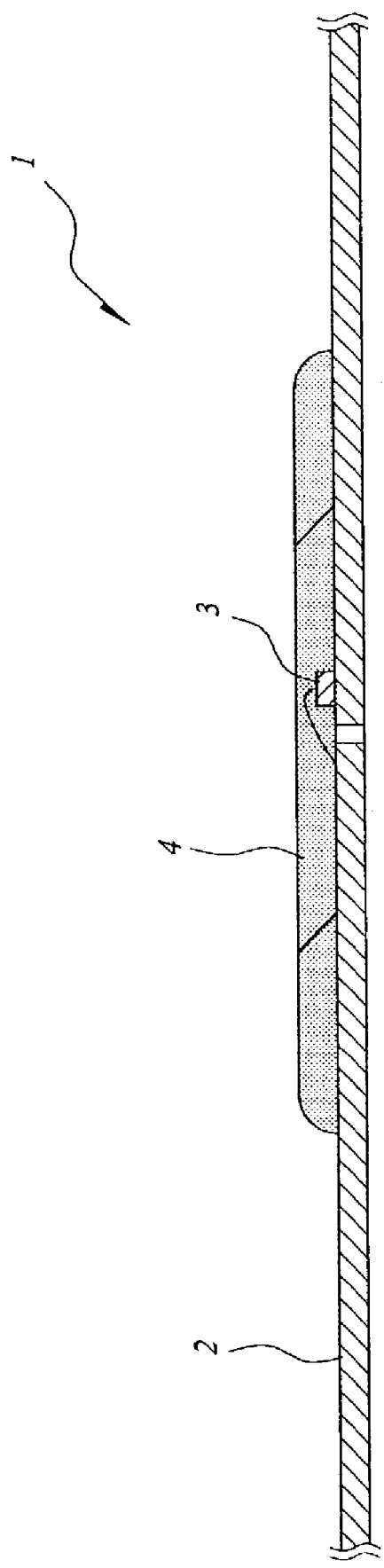
FIG. 3 is a sectional view showing the principal part of the electronic tag according to the embodiment of the present invention.

FIG. 1 is a plan view showing an electronic tag of this embodiment, FIG. 2 is a side plan view thereof, and FIG. 3 is a plan view showing the principal part of the electronic tag.

An electronic tag 1 of this embodiment is a non-contact type electronic tag provided with an antenna for receiving microwave and has such a structure that one semiconductor chip 3 is mounted at the approximate center of a lead (conductor piece) 2 composed of an elongated rectangular thin plate which constitutes the antenna, and the semiconductor chip 3 is sealed with potting resin 4.

The lead 2 has a length of 53 mm, and is optimized so as to efficiently receive microwave with a frequency of 2.45 GHz. Also, the lead 2 has a width of 3 mm, and is optimized so as to obtain both the reduction in size and the strength of the electronic tag 1. The lead 2 is composed of a thin Cu plate whose both surfaces are plated with Ag, and a thickness thereof is 0.11 mm.

Figure 4:
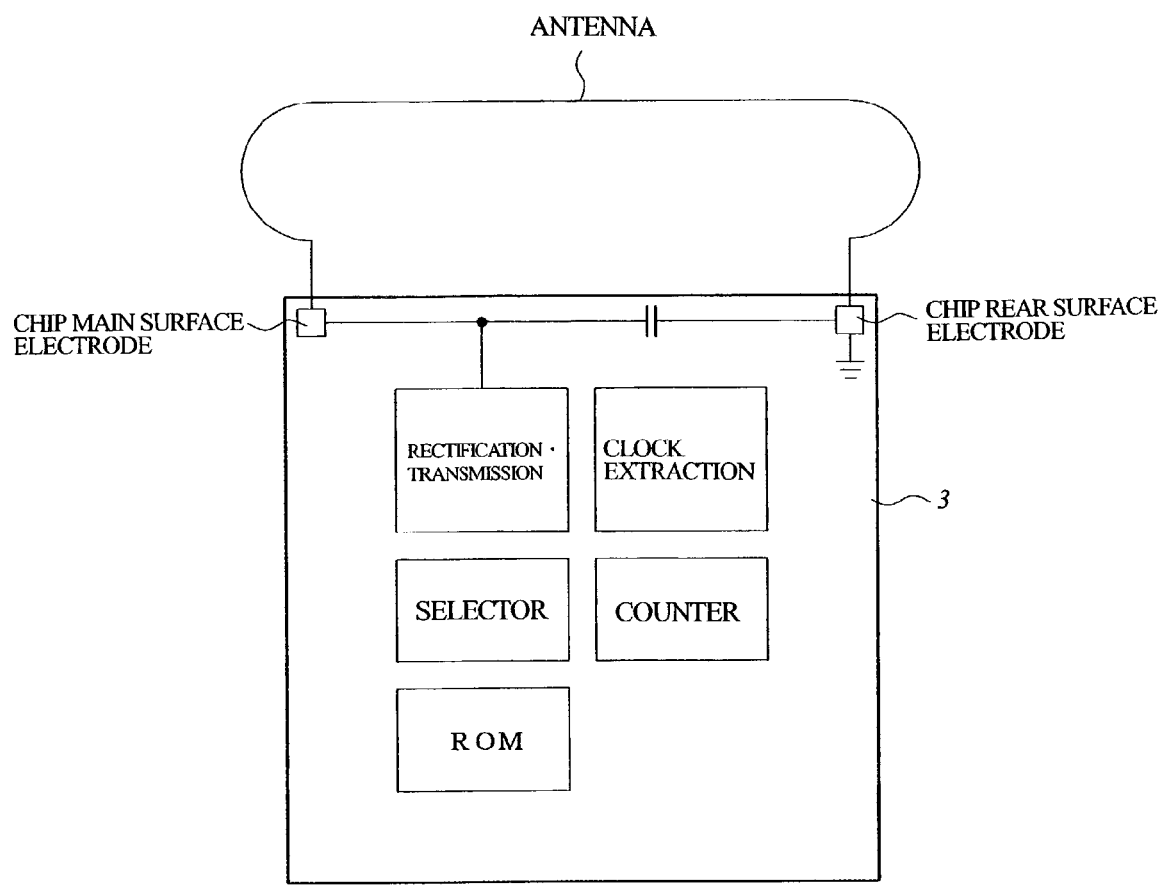
FIG. 4 is a block diagram showing a circuit configuration of the electronic tag according to the embodiment of the present invention.

FIG. 4 is a block diagram illustrating a circuit configuration of the semiconductor chip 3. The semiconductor chip 3 is made of single crystal silicon and has dimensions of 0.3 mm×0.4 mm and a thickness of 0.15 mm. Circuits such as a rectifying circuit, a transmitter circuit, a clock extraction circuit, a selector circuit, a counter circuit, and a ROM are formed in a device forming area on the main surface thereof. In addition, a bonding pad (not shown) is formed outside the device forming area.

The ROM has a memory capacity of 128 bits, and thus, can store a larger amount of data in comparison to the tag using a bar code. Also, the ROM has an advantage that the data stored in the ROM is more difficult to be unfairly manipulated in comparison to the data stored in a bar code.

Figure 5:
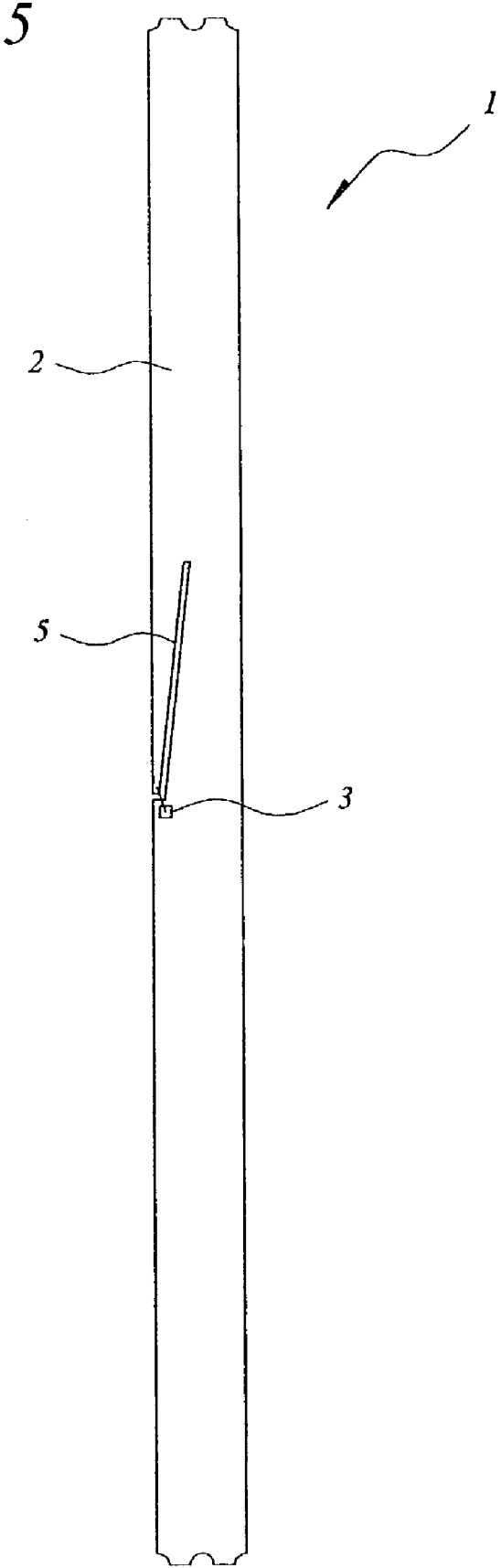
FIG. 5 is a plan view showing the electronic tag in the state where potting resin to seal a semiconductor chip is removed.
Figure 6:
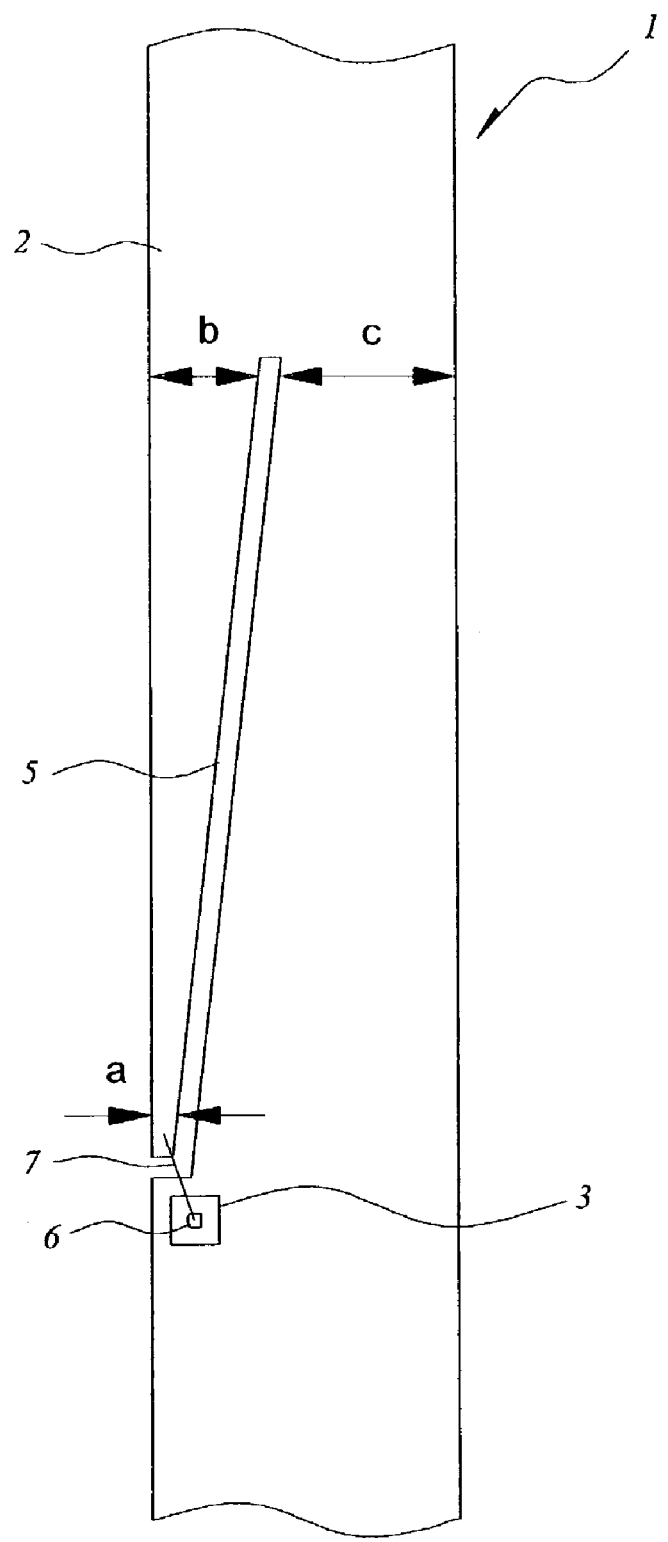
FIG. 6 is an enlarged plan view showing the principal part of the electronic tag shown in FIG. 5.

FIG. 5 is a plan view showing a state of the electronic tag 1 in which the potting resin 4 for sealing the semiconductor chip 3 is removed, and FIG. 6 is an enlarged plan view showing the principal part of FIG. 5.

As shown in FIGS. 5 and 6, a thin slit 5 having one end reaching an outer edge of the lead 2 is formed at the approximate center of the lead 2. The slit 5 has a length of 8 mm, and the length is optimized so as to obtain a proper high-frequency characteristic.

The semiconductor chip 3 is mounted on the lead 2 near the slit 5 with the main surface of the chip 3 facing upward. A bump electrode 6 made of Au is formed on the main surface of the semiconductor chip 3, and one end of an Au wire 7 is bonded onto the bump electrode 6. The Au wire 7 extends over the slit 5, and the other end thereof is bonded onto a part of the lead 2 facing to the mounting area of the semiconductor chip 3 across the slit 5.

In the above-described structure, since the slit 5 having one end reaching the outer edge of the lead 2 is formed in a part of the lead 2, the effective length of the lead 2, in other words, the antenna length can be increased. Therefore, it becomes possible to achieve the reduction in size of the electronic tag 1 while sufficiently maintaining a required antenna length.

Although not particularly limited, the slit 5 extends in a direction diagonal to the longitudinal direction of the lead 2. More specifically, as shown in FIG. 6, the lead width (b) in the side of the other end of the slit 5 is wider than the lead width (a) in an area where the Au wire 7 is bonded.

In the above-described structure, since the lead width (b) in the side of the other end of the slit 5 is widened, even in the case where an external force is applied to the bonding area of the Au wire 7 during the manufacturing process of the electronic tag 1, the lead 2 in the bonding area is hard to deform. Therefore, the bonding failure of the Au wire 7 due to the deformation of the lead 2 can be effectively prevented.

Also, the width of the slit 5 is 0.2 mm, which is much narrower than the width of the lead 2 (3 mm). Furthermore, the other end of the slit 5 terminates at the approximate center of the lead 2 in terms of the width direction thereof.

In this case, the lead width (b) and the lead width (c) in the side of the other end of the slit 5 shown in FIG. 6 are 1.1 mm and 1.7 mm, respectively. More specifically, the width of the lead 2 is sufficiently wider than that of the slit 5 even at the narrowest portion. Therefore, the lead 2 is hard to deform even if the slit 5 is formed in the lead 2 having a decreased width of 3 mm. Consequently, it becomes possible to achieve the reduction in size of the electronic tag 1 while sufficiently maintaining a required strength. Further, the process of applying the reinforcing tape to the rear surface of the lead 2 for the prevention of the deformation of the lead 2 during the manufacturing process of the electronic tag 1 is no longer required.

Figure 7:
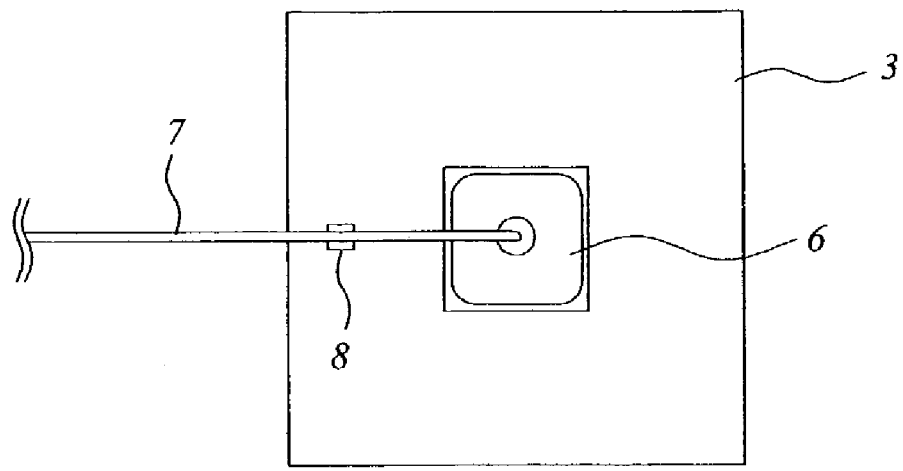
FIG. 7 is a plan view showing the semiconductor chip mounted on the electronic tag according to the embodiment of the present invention.
Figure 8:
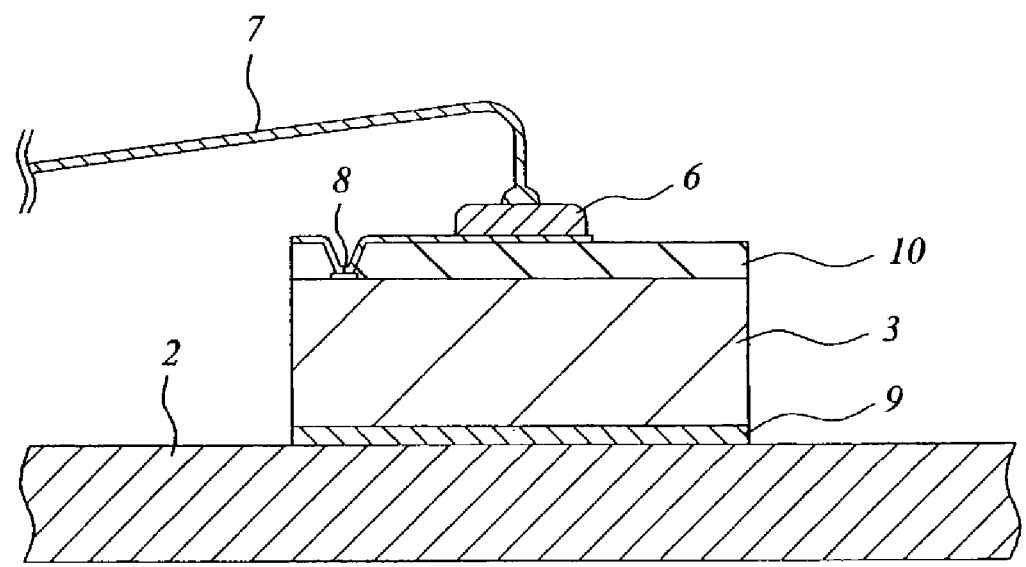
FIG. 8 is a sectional view showing the semiconductor chip mounted on the electronic tag according to the embodiment of the present invention.

FIG. 7 is a plan view showing the main surface of the semiconductor chip 3 mounted on the lead 2, and FIG. 8 is a sectional view showing the semiconductor chip 3. Note that the illustration of the potting resin 4 used to seal the semiconductor chip 3 is omitted.

One bump electrode 6 is formed in the device forming area on the main surface of the semiconductor chip 3, and the Au wire 7 is bonded to the bump electrode 6. The bump electrode 6 is connected to the circuit shown in FIG. 4 through a bonding pad 8 formed on a peripheral area (area other than the device forming area) on the main surface of the semiconductor chip 3.

The rear surface of the semiconductor chip 3 constitutes the other electrode, and the semiconductor chip 3 is directly connected to the upper surface of the lead 2 via an Ag paste 9. More specifically, the semiconductor chip 3 has one electrode (bump electrode 6) formed on the main surface thereof and the other electrode formed on the rear surface thereof.

In the structure described above, the impact applied to the circuit of the semiconductor chip 3 when bonding the Au wire 7 to the bump electrode 6 can be buffered and absorbed by the bump electrode 6. Therefore, it is possible to dispose the bump electrode 6 on the device forming area. Also, by forming an organic insulating film 10 with low elastic modulus on the uppermost layer on the main surface of the semiconductor chip 3 and forming the bump electrode 6 on the organic insulating film 10 as shown in FIG. 8, the impact applied to the circuit at the time of the wire bonding can be buffered and absorbed by the bump electrode 6 and the organic insulating film 10.

As described above, by disposing the bump electrode 6 on the device forming area of the semiconductor chip 3, further reduction in size of the semiconductor chip 3 and the reduction in manufacturing cost of the electronic tag 1 can be achieved in comparison to the case where an area for disposing the bump electrode 6 is required in addition to the device forming area of the semiconductor chip 3. In addition, in such a case where a bonding electrode is disposed in an area other than the device forming area, the device is unlikely to be destroyed by the shock at the time of the wire bonding. Therefore, it is also possible to directly bond the wire 7 to an electrode formed of a part of the wiring on the main surface of the semiconductor chip 3 instead of forming the bump electrode 6. In this case, since the process for forming the bump electrode 6 is unnecessary, the cost for the electronic tag 1 can be reduced.

Also, in the above-described structure, since one electrode is formed on the main surface of the semiconductor chip 3 and the other electrode is formed on the rear surface of the semiconductor chip 3, the surface size of the semiconductor chip 3 can be reduced in comparison to that of the semiconductor chip 3 having the two electrodes formed on the main surface thereof. Accordingly, the number of chips per wafer can be increased, and thus, it is possible to reduce the manufacturing cost of the electronic tag 1 as well as the manufacturing cost of the semiconductor chip 3.

Furthermore, in the above-described structure, since the semiconductor chip 3 is connected to the lead 2 by the well-known wire bonding method, the manufacturing cost of the electronic tag 1 can be reduced in comparison to the case where the semiconductor chip 3 is connected to the lead 2 by the flip chip method or the TAB method.

Next, a method of manufacturing the electronic tag 1 having the structure as described above will be described with reference to FIGS. 9 to 17.

Figure 9:
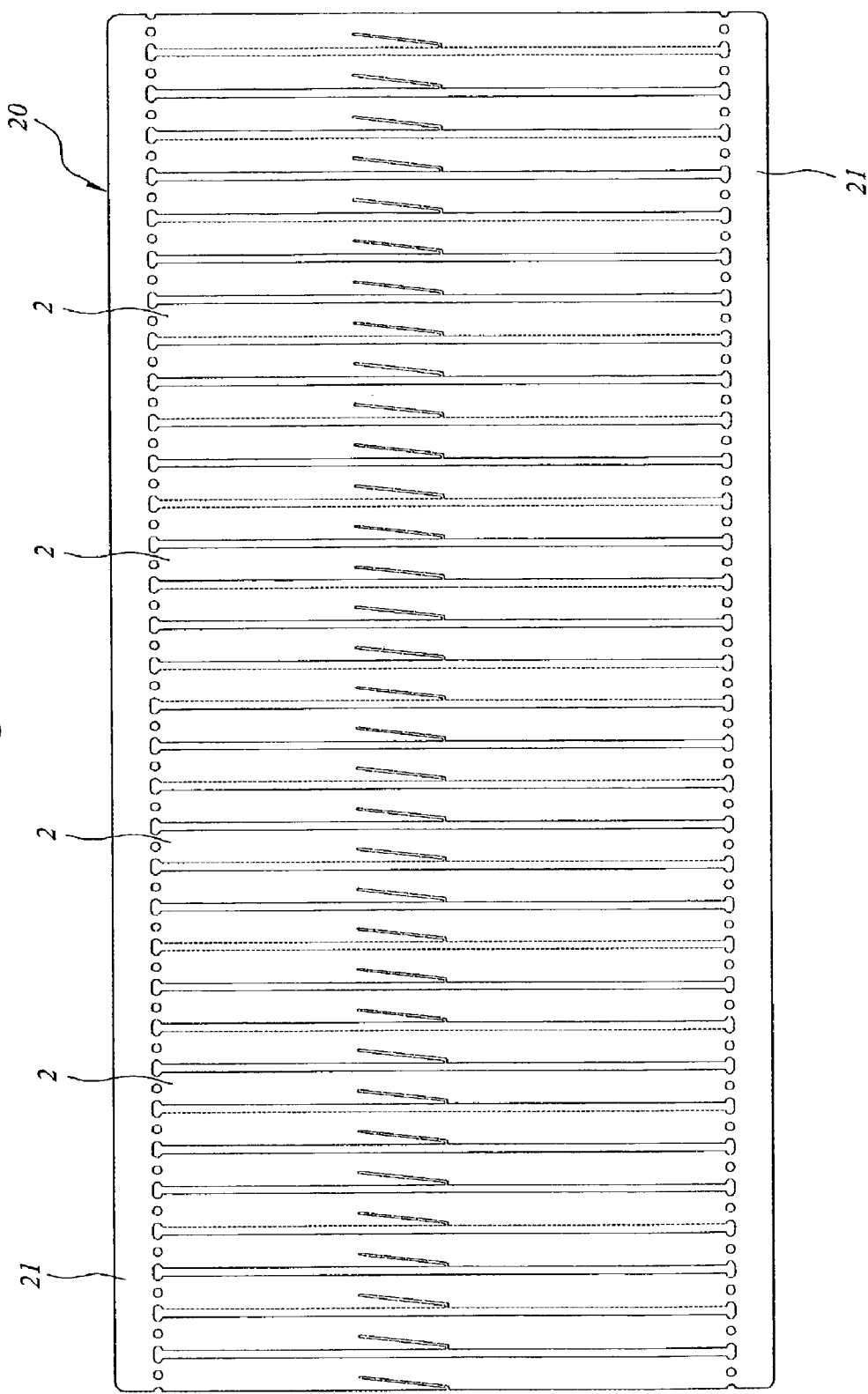
FIG. 9 is a plan view showing a lead frame used in the manufacture of the electronic tag according to the embodiment of the present invention.

FIG. 9 is a plan view showing an entire configuration of the lead frame 20 used in the manufacture of the electronic tag 1.

The configuration of the lead frame 20 is as follows. That is, a plurality of leads 2 are arranged in parallel to each other, and a pair of support frames 21 hold both longitudinal ends of these leads 2. More specifically, in the lead frame 20, the leads 2 are arranged in such a manner that the extending direction of the support frames 21 and the longitudinal direction of the leads 2 cross at right angles. Also, in the lead frame 20, no lead frame is provided between the leads 2, and the leads 2 are held by the lead frames 21 only.

In the lead frame 20 with the above-described configuration, since the support frame is not provided between the leads 2, a large number of leads 2 can be arranged closely to each other. Therefore, more number of leads 2 can be obtained from one lead frame 20, which makes it possible to reduce the unit cost of the lead 2.

Figure 10:
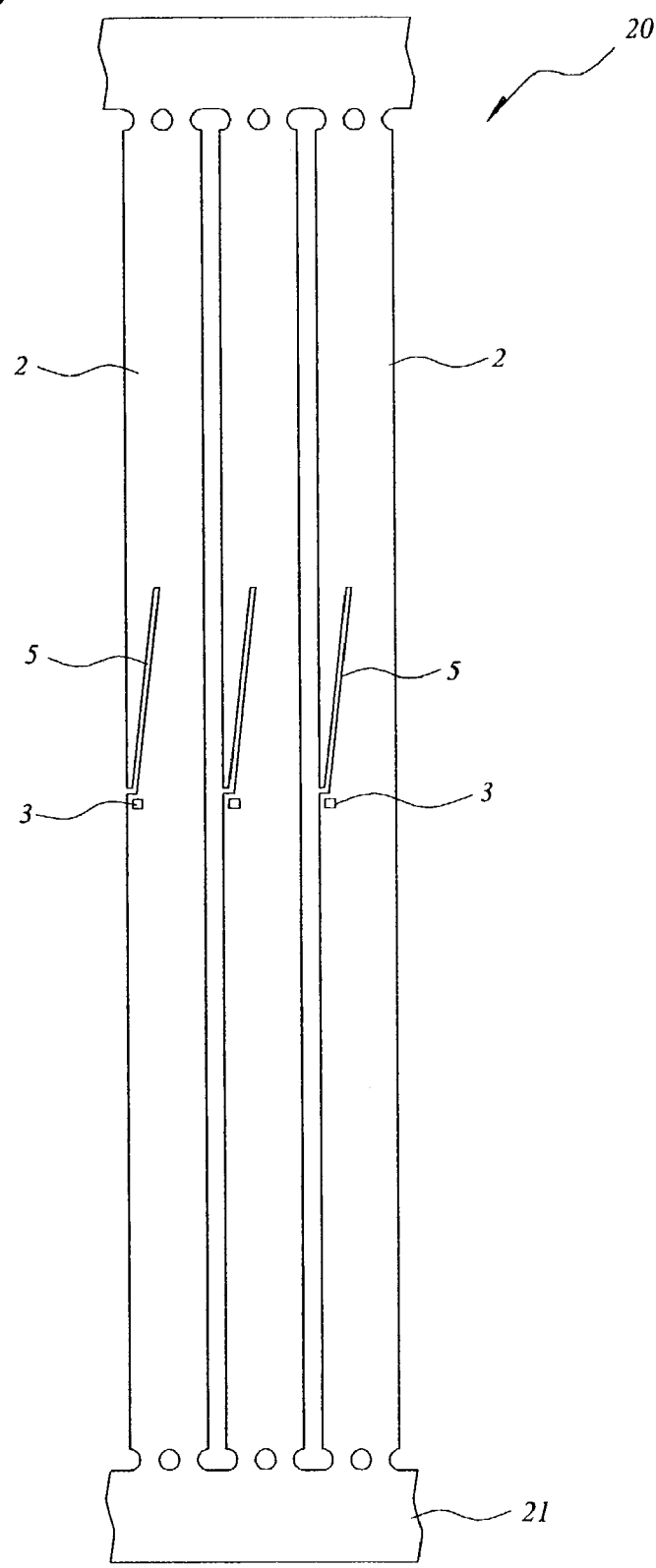
FIG. 10 is a plan view showing the principal part in a manufacturing method of the electronic tag according to the embodiment of the present invention.
Figure 11:
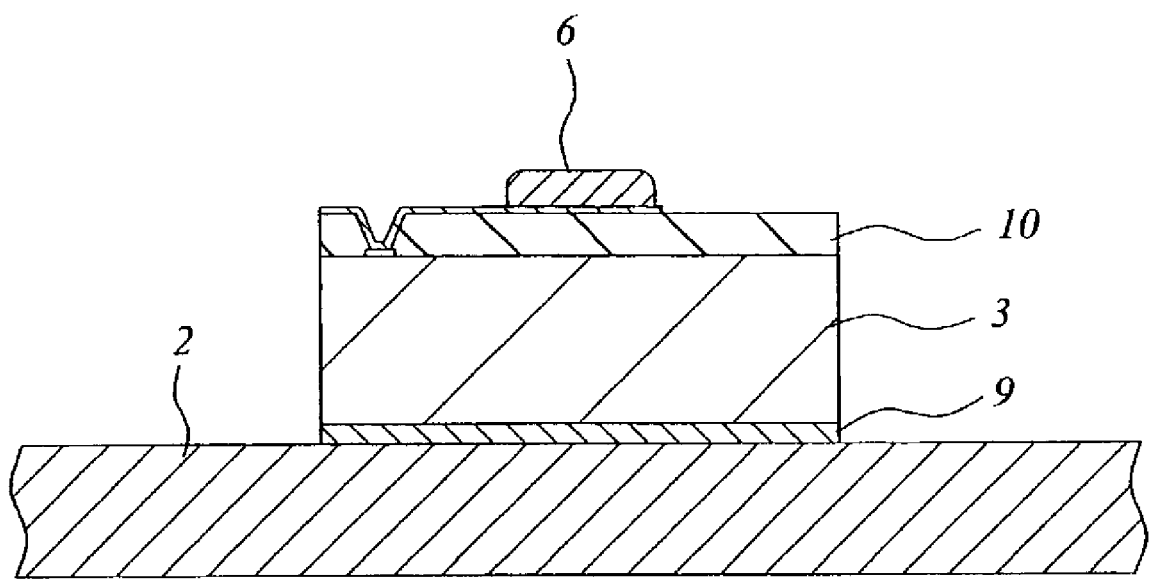
FIG. 11 is a sectional view showing the principal part in the manufacturing method of the electronic tag according to the embodiment of the present invention.

The method of manufacturing the electronic tag 1 by using the lead frame 20 is as follows. First, the semiconductor chip 3 is mounted on each lead 2 by the use of the Ag paste 9 as shown in FIGS. 10 and 11. Note that the bump electrode 6 is formed on the main surface of the semiconductor chip 3 in advance.

Figure 12:
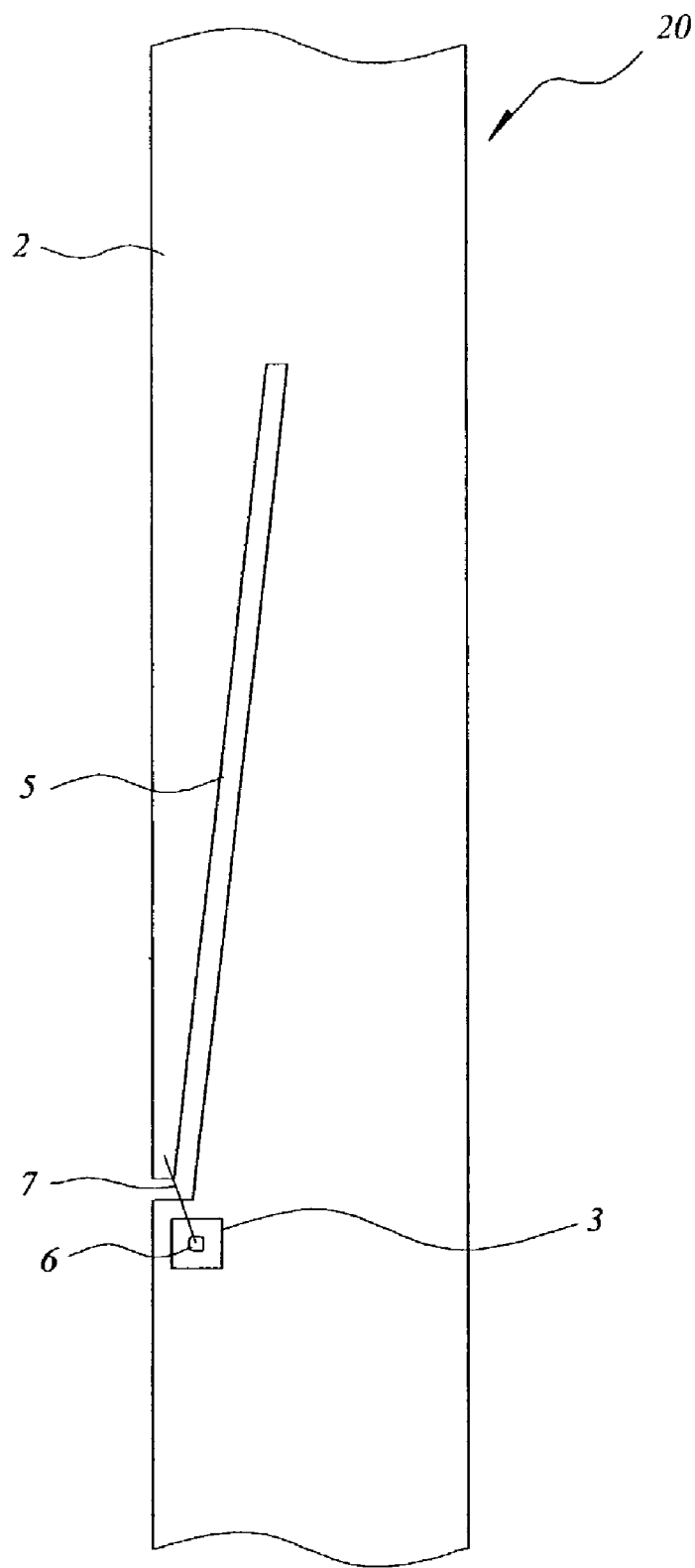
FIG. 12 is a plan view showing the principal part in the manufacturing method of the electronic tag according to the embodiment of the present invention.
Figure 13:
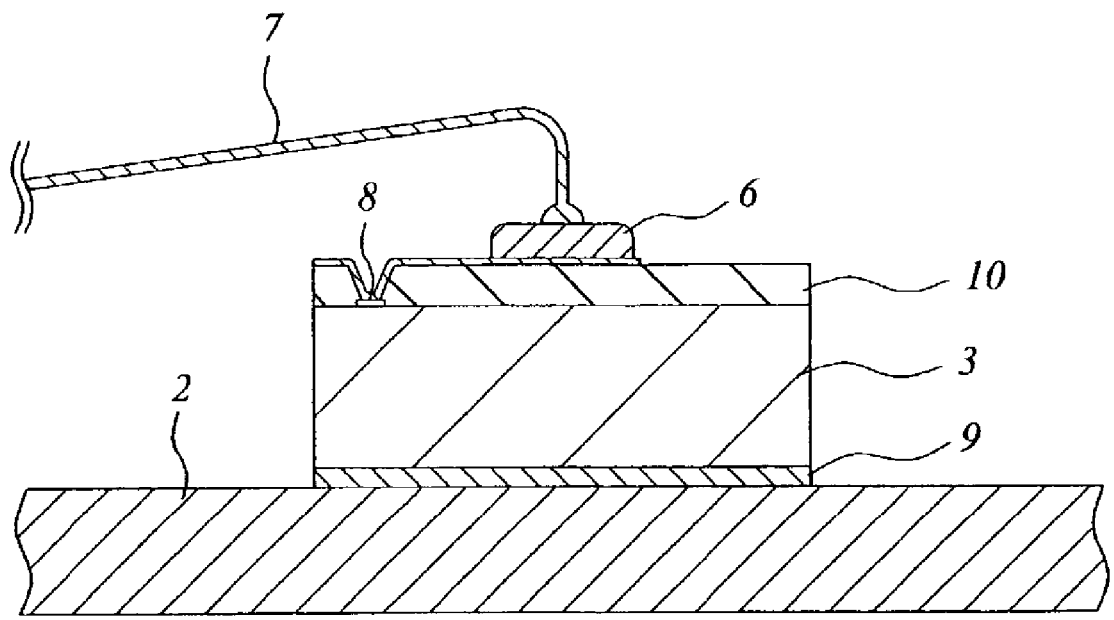
FIG. 13 is a sectional view showing the principal part in the manufacturing method of the electronic tag according to the embodiment of the present invention.

Next, as shown in FIGS. 12 and 13, one end of the Au wire 7 is bonded to the bump electrode 6 on the semiconductor chip 3, and the other end of the Au wire 7 is bonded to the lead 2.

Figure 14:
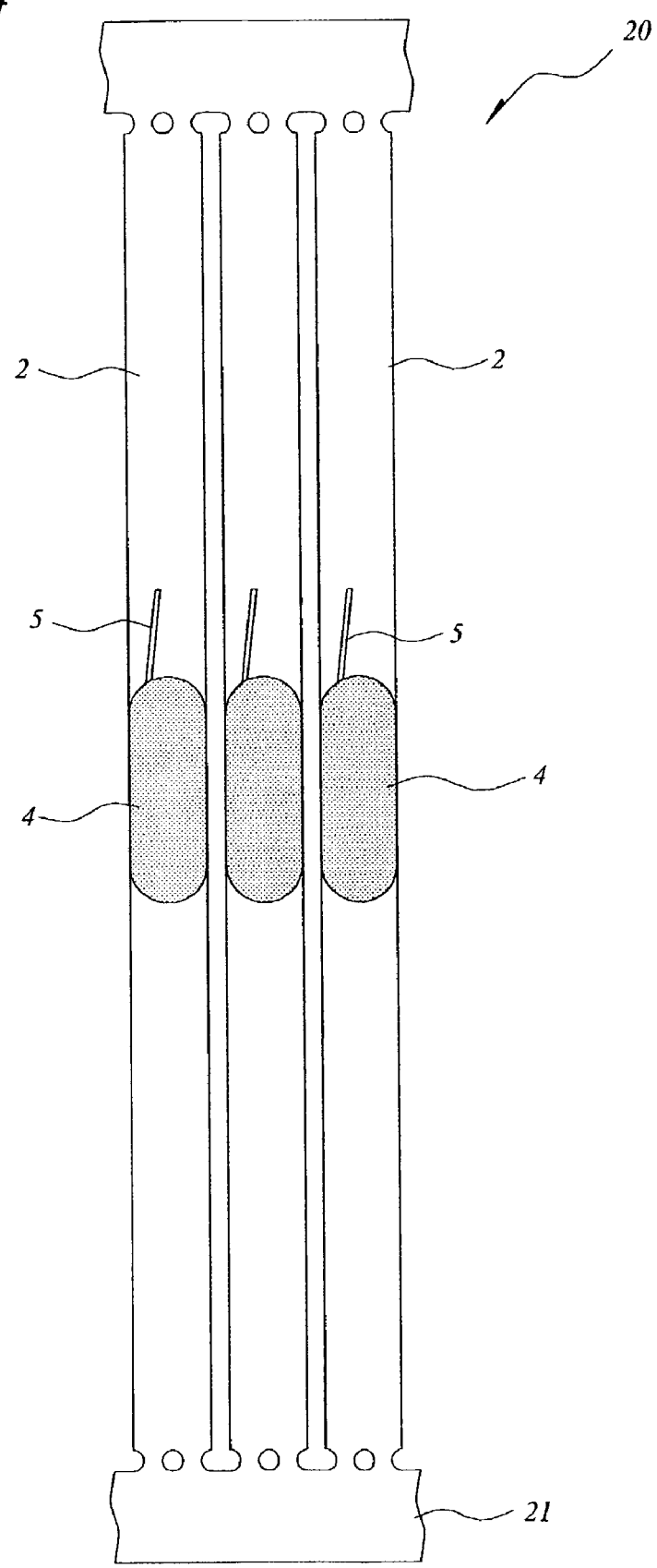
FIG. 14 is a plan view showing the principal part in the manufacturing method of the electronic tag according to the embodiment of the present invention.

Subsequently, the semiconductor chip 3 and the Au wire 7 on each of the leads 2 are sealed with the potting resin 4 as shown in FIG. 14. In this case, as shown in FIG. 14, the coating of the potting resin 4 is controlled so that the length of the potting resin 4 along the longitudinal direction of the lead 2 can be longer than that along the lateral direction of the lead 2, and the slit 5 is also covered with the potting resin 4.

Note that the potting resin 4 is preferably coated on only one surface of the lead 2. If the potting resin 4 is coated on both surfaces of the leads 2, the flatness of the lead 2 is lost, and adhesive force of the electronic tag 1 to an article is reduced.

Figure 15:
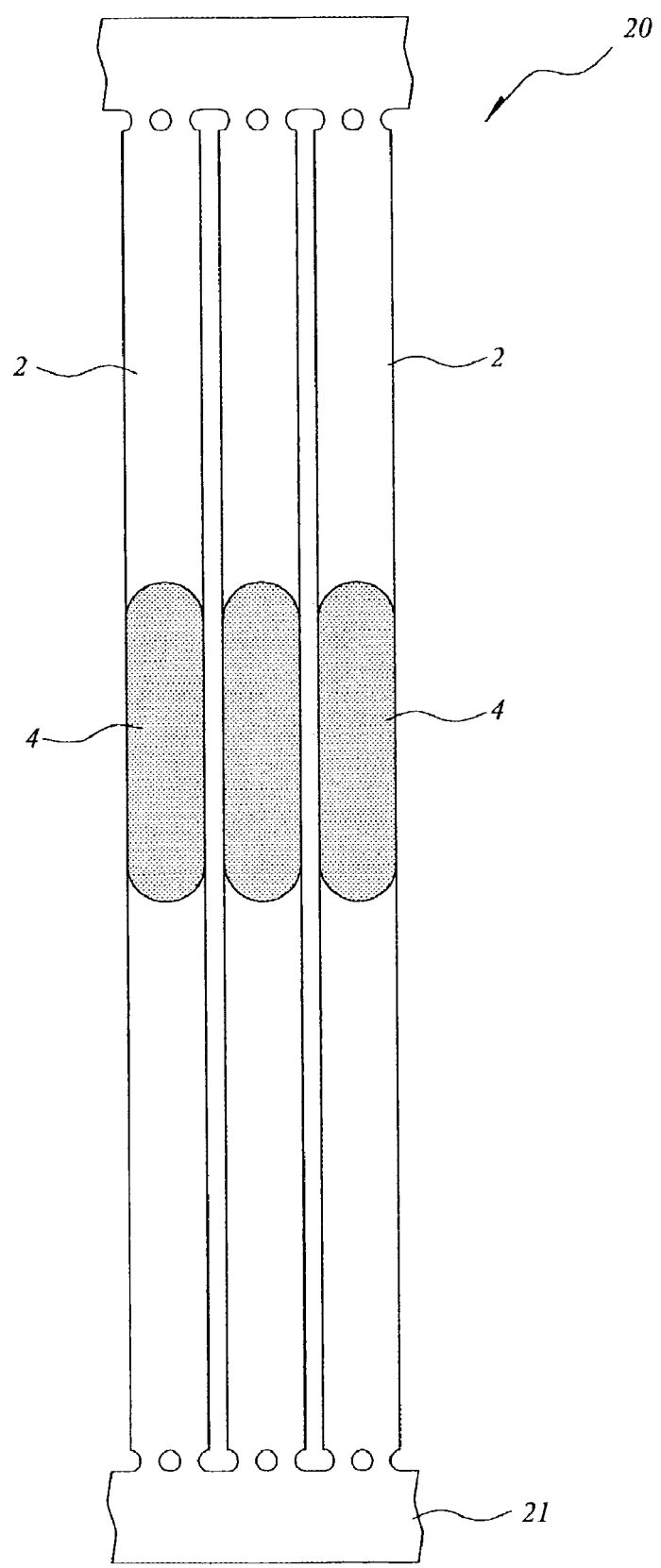
FIG. 15 is a plan view showing the principal part in the manufacturing method of the electronic tag according to another embodiment of the present invention.
Figure 16:
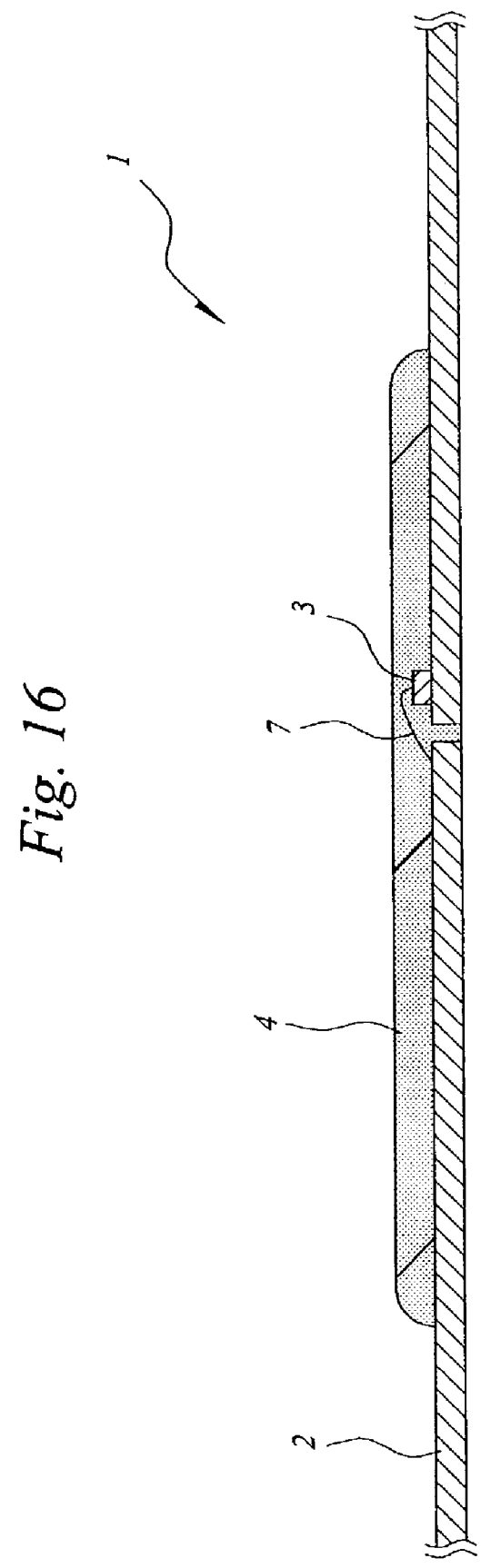
FIG. 16 is a sectional view showing the principal part in the manufacturing method of the electronic tag according to another embodiment of the present invention.
Figure 17:
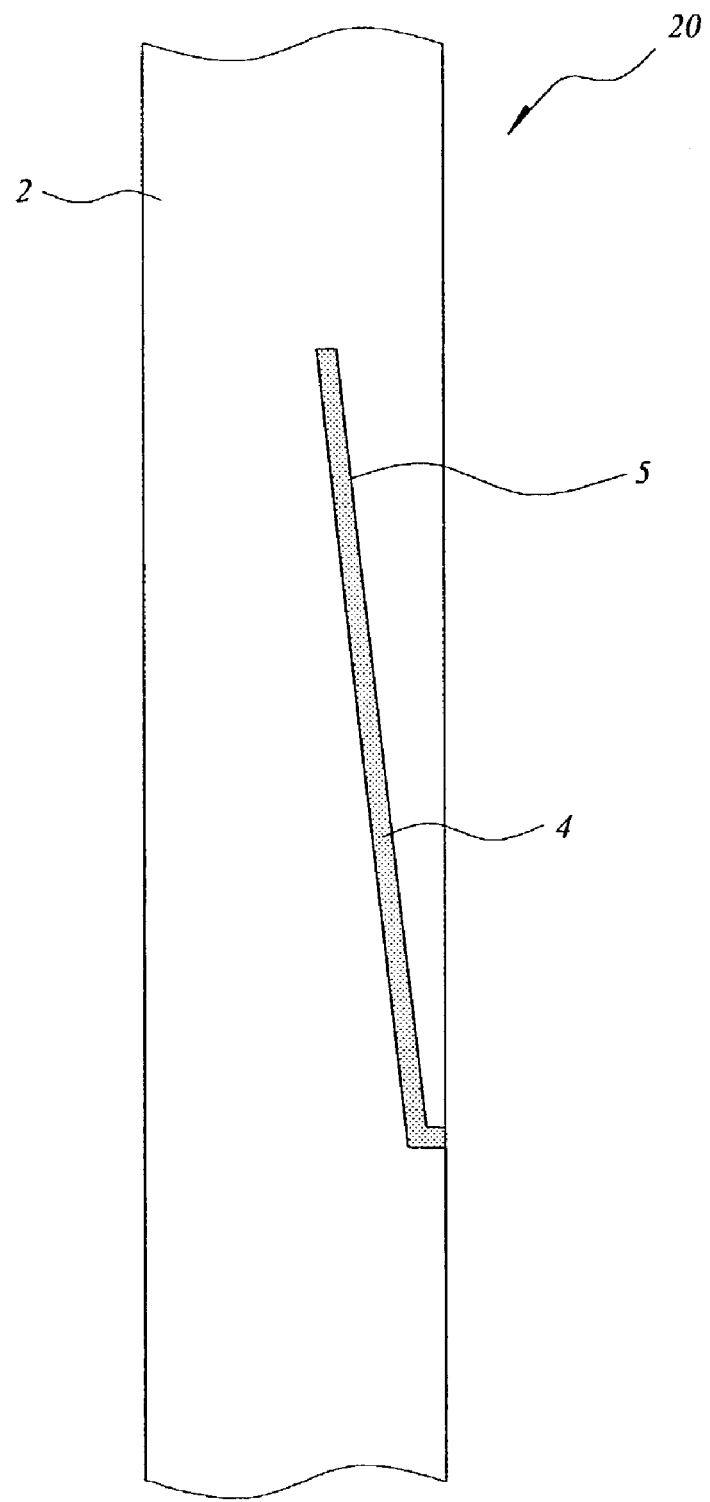
FIG. 17 is a plan view showing the principal part in the manufacturing method of the electronic tag according to another embodiment of the present invention.

In addition, the case where the other end of the slit 5 is not covered with the potting resin 4 is exemplified in the example shown in FIG. 14. However, it is also possible to cover the entire of the slit 5 with the potting resin 4 as shown in FIGS. 15 (plan view), 16 (sectional view) and 17 (back side view).

In the above-described configuration, since the slit 5 is covered with the potting resin 4, it is possible to prevent the short-circuit of the leads 2 in both sides of the slit 5 due to the adhesion of conductive foreign matters and water to the space of the slit 5. More specifically, since the length of the slit 5 is optimized in view of the oscillation characteristics, when the leads 2 in both sides of the slit 5 are short-circuited, the effective length of the slit 5 is shortened, and as a result, the characteristic is deteriorated. However, such deterioration in characteristic can be prevented by covering the slit 5 with the potting resin 4.

Also, if the coating of the potting resin 4 is more extended in the longitudinal direction of the lead 2, the length between the edge of the potting resin 4 in the longitudinal direction of the lead 2 and the semiconductor chip 3 is increased. Accordingly, the bending stress applied to the semiconductor chip 3 and the Au wire 7 at the time of bending the lead 2 is reduced, and thus, such problems as the detachment of the semiconductor chip 3 and the breakage of the Au wire 7 can be prevented. As a result, the operational reliability of the electronic tag 1 is enhanced.

In addition, in the lead frame 20 in which the leads 2 are arranged so that the extending direction of the support frames 21 and the longitudinal direction of the leads 2 cross at right angles, the intervals between the adjacent two leads 2 are extremely short. Therefore, it is possible to reduce the amount of movement of the lead frame 20 in the processes for each of the leads 2 such as the mounting of the semiconductor chip 3, the bonding of the Au wire 7, and the coating of the potting resin 4. As a result, the workability in the manufacture of the electronic tag 1 can be improved.

Thereafter, both ends of the leads 2 are cut off to separate the support frame 21, thereby completing the electronic tag 1 shown in FIGS. 1 to 3. When cutting off both ends of the leads 2, adhesive tape is applied to the rear surface of the lead frame 20 in advance, and then, the adhesive tape to which the leads 2 separated from the lead flame 20 are adhered is rolled up. In this case, since the leads 2 are arranged so that the longitudinal direction of the leads 2 and the rolling-up direction of the adhesive tape cross at right angles, the leads 2 adhered to the adhesive tape are not deformed.

Figure 18:
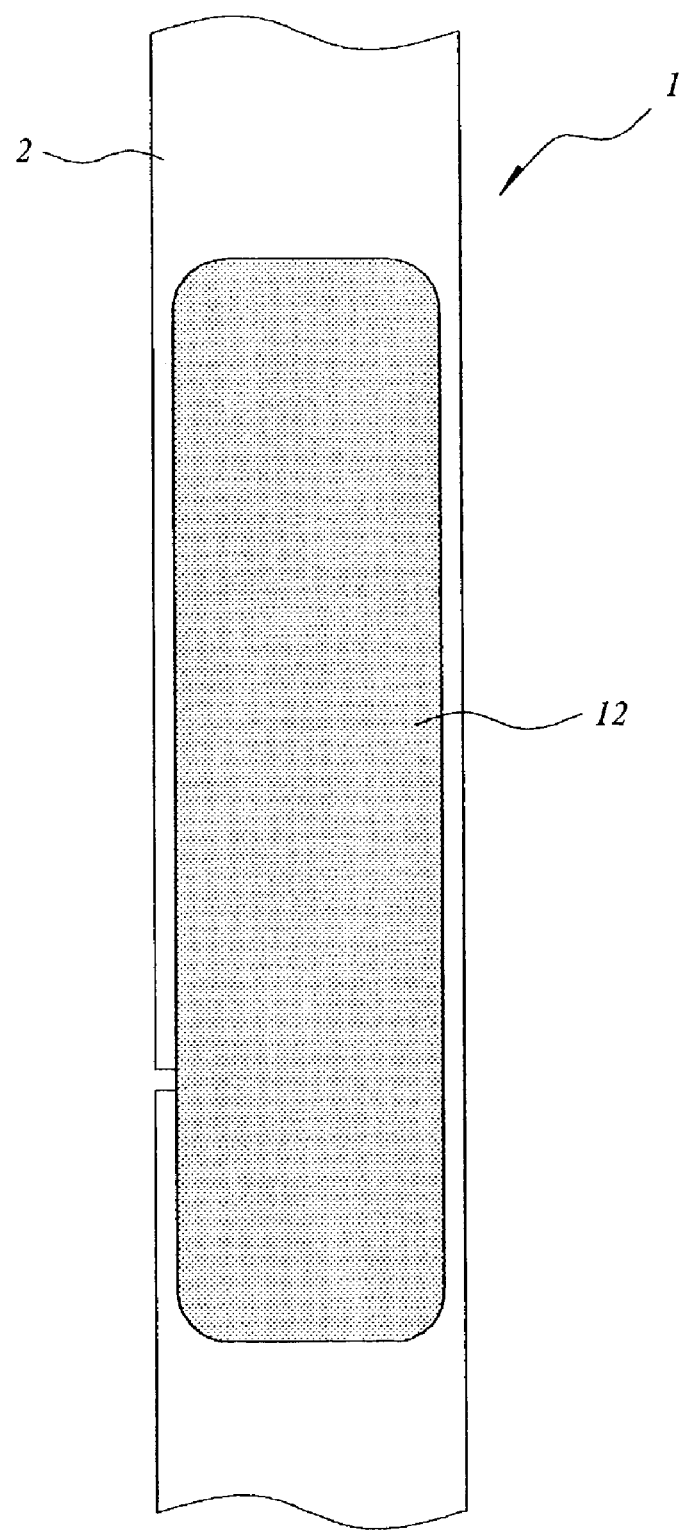
FIG. 18 is a plan view showing the principal part in the manufacturing method of the electronic tag according to another embodiment of the present invention.
Figure 21:
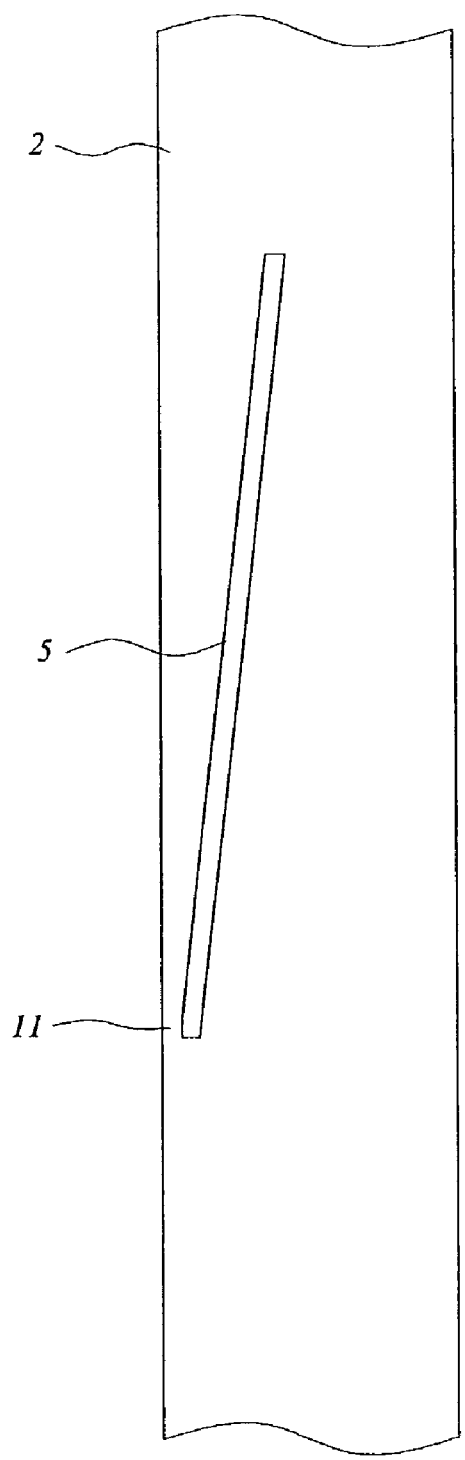
FIG. 21 is a plan view showing the principal part in the manufacturing method of the electronic tag according to another embodiment of the present invention.
Figure 22:
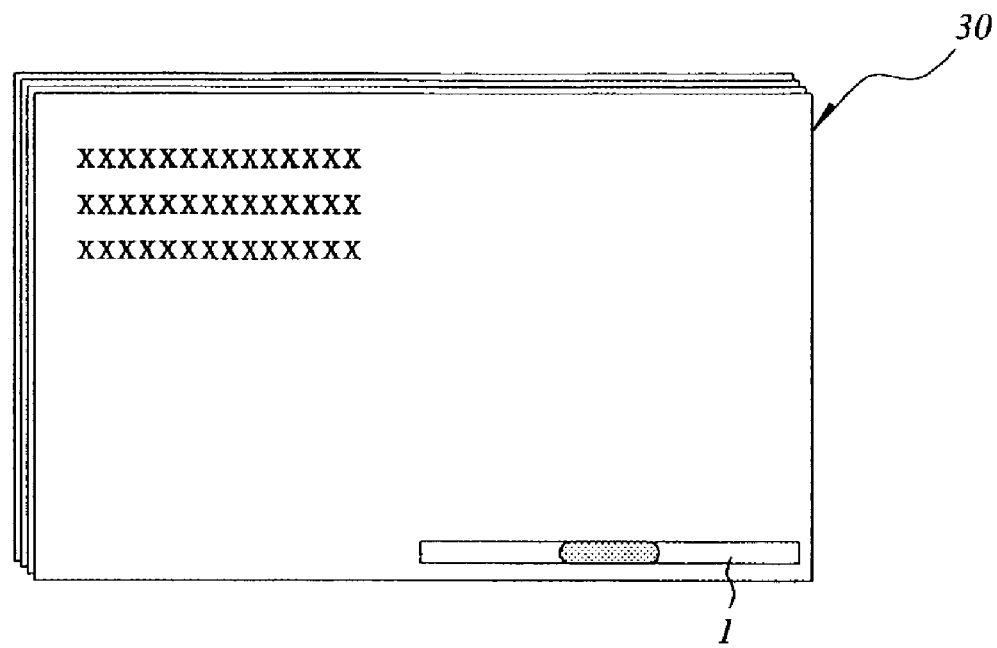
FIG. 22 is an explanatory drawing for a method of using the electronic tag according to the present invention.
Figure 23:
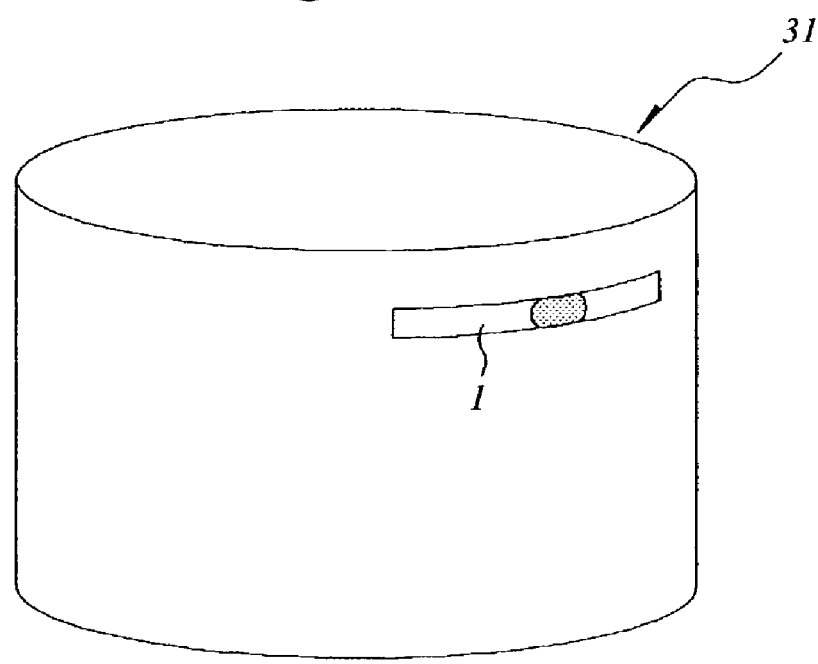
FIG. 23 is an explanatory drawing for the method of using the electronic tag according to the present invention.
Figure 24:
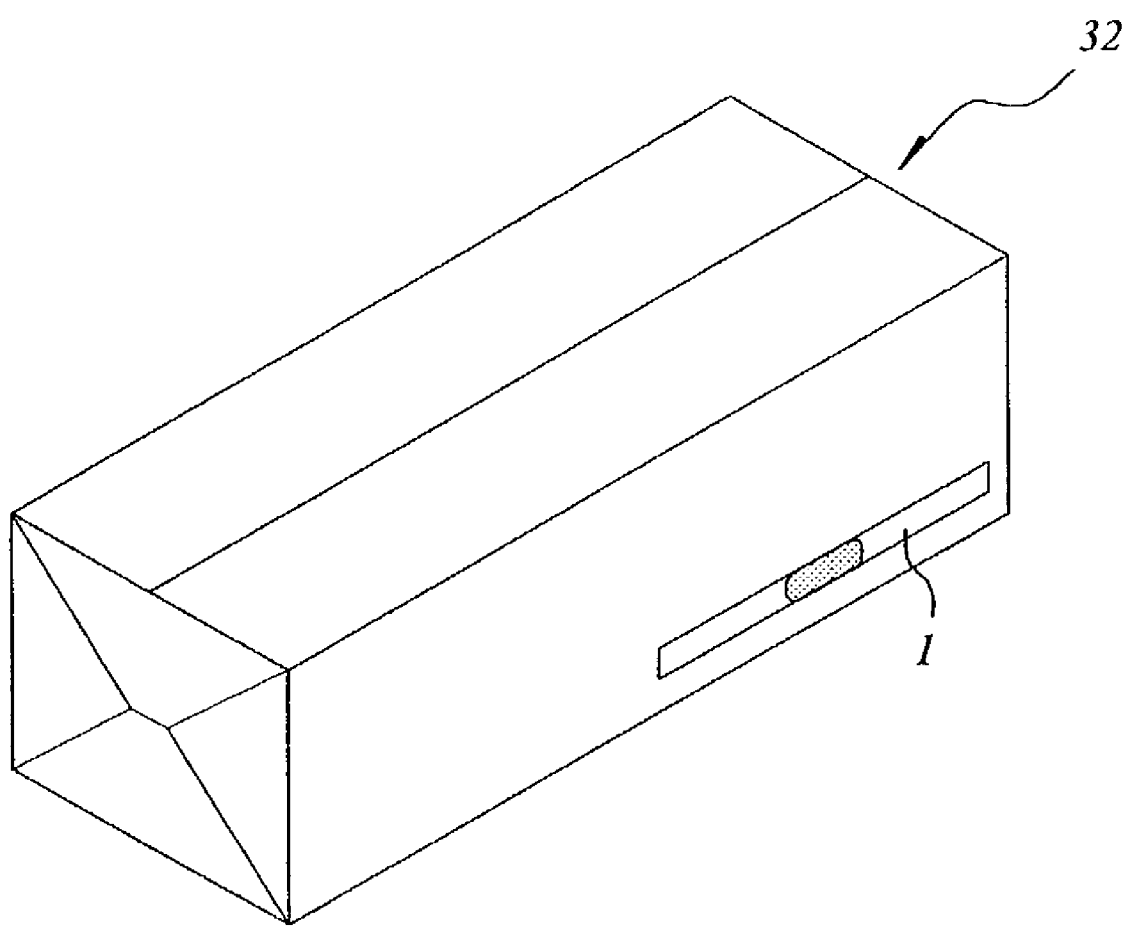
FIG. 24 is an explanatory drawing for the method of using the electronic tag according to the present invention.
Figure 25:
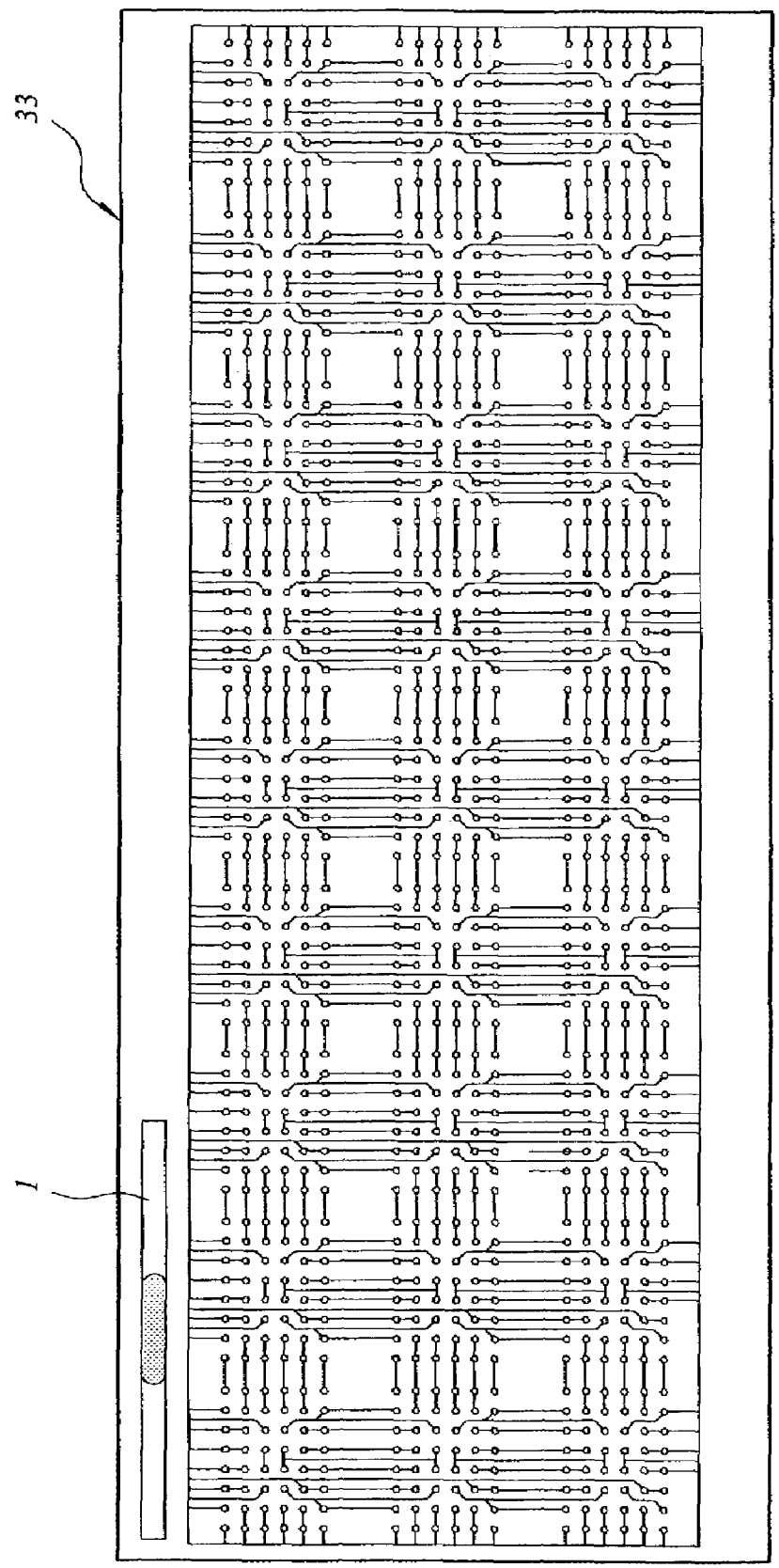
FIG. 25 is an explanatory drawing for the method of using the electronic tag according to the present invention.
Figure 26:
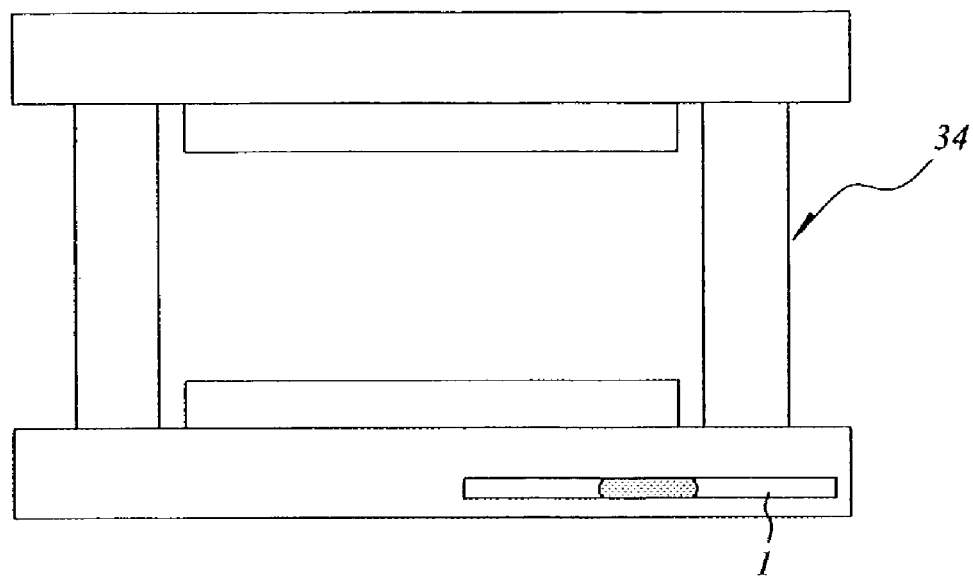
FIG. 26 is an explanatory drawing for the method of using the electronic tag according to the present invention.
Figure 27:
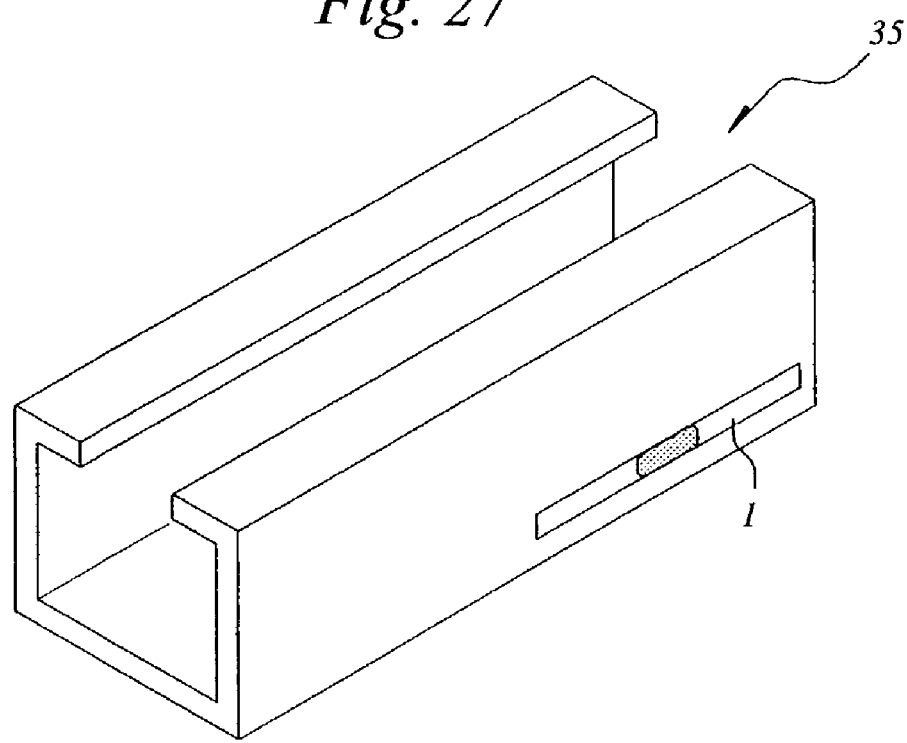
FIG. 27 is an explanatory drawing for the method of using the electronic tag according to the present invention.

As shown in FIGS. 18 (plan view), 19 (sectional view) and 20 (back side view), it is also possible to seal the semiconductor chip 3 and the Au wire 7 with resin 12 formed by the transfer mold method using a metal die for sealing. In this case, a dam 11 is formed at one end of the slit 5 as shown in FIG. 21 and the resin sealing is performed in this state, thereby preventing the problem that the resin is flown out from the end of the slit 5 in the molding die. A predetermined antenna length can be obtained by cutting out the dam 11 after the finish of the molding process.

Figure 19:
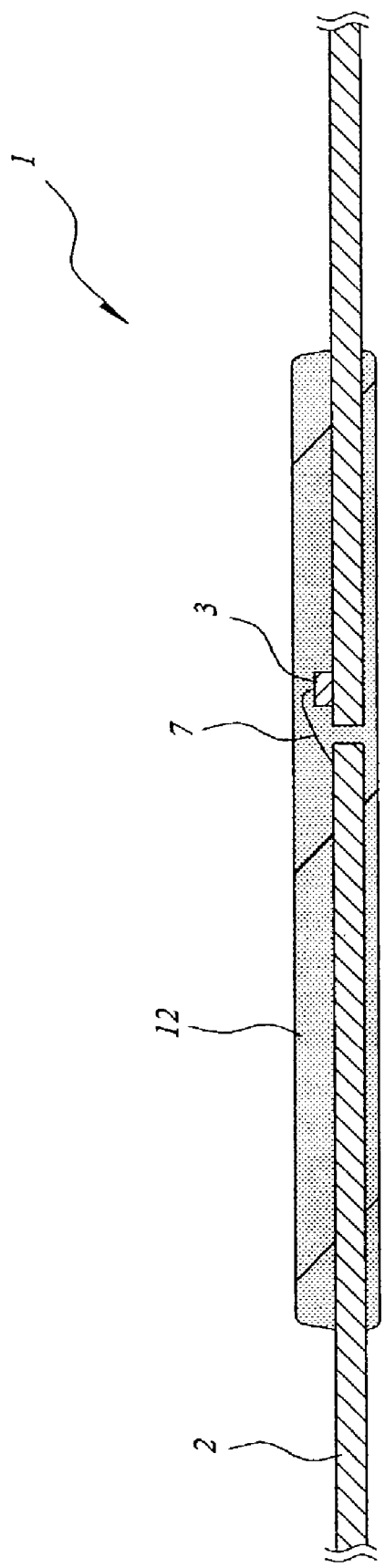
FIG. 19 is a sectional view showing the principal part in the manufacturing method of the electronic tag according to another embodiment of the present invention.
Figure 20:
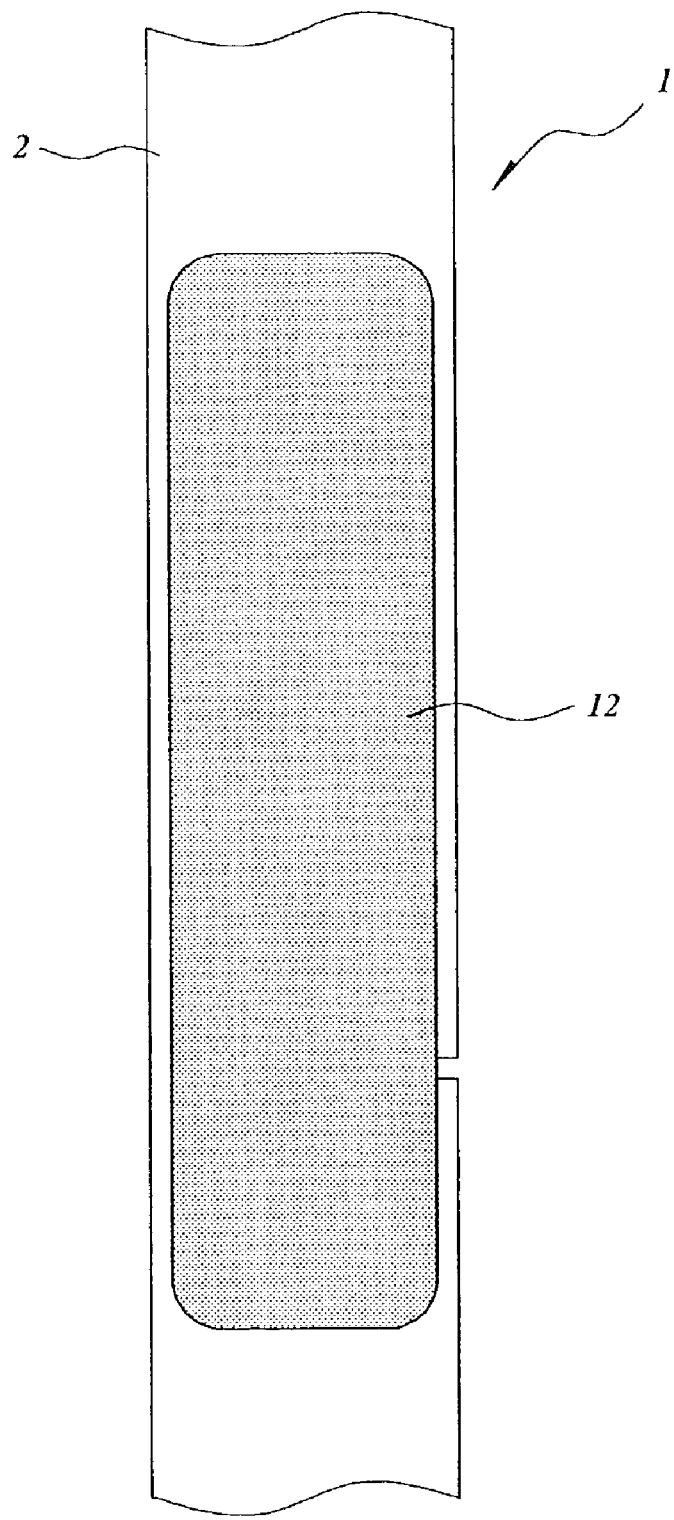
FIG. 20 is a plan view showing the principal part in the manufacturing method of the electronic tag according to another embodiment of the present invention.

In addition, in the case of using the transfer mold method, both surfaces of the lead 2 can be more easily covered with the resin 12 in comparison to the case of using the potting method. Accordingly, the inside of the slit 5 can be completely sealed with the resin 12 as shown in FIGS. 18 to 20, and thus, it is certainly possible to prevent the deterioration of the radio characteristics due to the leakage across the slit.

Also, the use of the transfer mold method makes it easy to decrease the thickness of the resin 12 formed on the rear surface of the lead 2 even in such a case where both surfaces of the lead 2 are covered with the resin 12. Therefore, the reduction in the adhesive force of the electronic tag 1 to an article can be inhibited.

When in use, the electronic tag 1 according to this embodiment manufactured in the above-described manner is adhered to the surface of the various kinds of articles shown in FIGS. 22 to 27 by the use of double-faced adhesive or the like. For example, FIG. 22 exemplifies the case where the electronic tag 1 is adhered to a surface of a slip 30. Similarly, FIG. 23 exemplifies the case of a cylindrical container 31, FIG. 24 exemplifies the case of a square box 32 such as a container, FIG. 25 exemplifies the case of a printed wiring board 33, FIG. 26 exemplifies the case of a metal die 34, and FIG. 27 exemplifies the case of a carrier 35 to convey a magazine used in the manufacturing process of a semiconductor package, respectively.

(Second Embodiment)

Next, a method of the shipment of the electronic tag 1 according to the first embodiment from the manufacturer to the customer will be described.

As described above, the electronic tag 1 is manufactured in such a manner as follows. That is, after performing the die bonding process (FIGS. 10 and 11) for mounting the semiconductor chip 3 on each lead 2 in the lead frame 20, the wire bonding process (FIGS. 12 and 13) for connecting the semiconductor chip 3 and the lead 2 with the Au wire 7, and the resin sealing process (FIG. 14) for sealing the semiconductor chip 3 and the Au wire 7 with the potting resin 4 (or the molding resin), the support frames 21 of the lead frame 20 are cut to obtain the pieces of leads 2. In addition, as the occasion demands, the marking or the plating for printing the product name and the deburring of the molding resin are performed in advance of the cutting of the lead frame 20.

Figure 28:
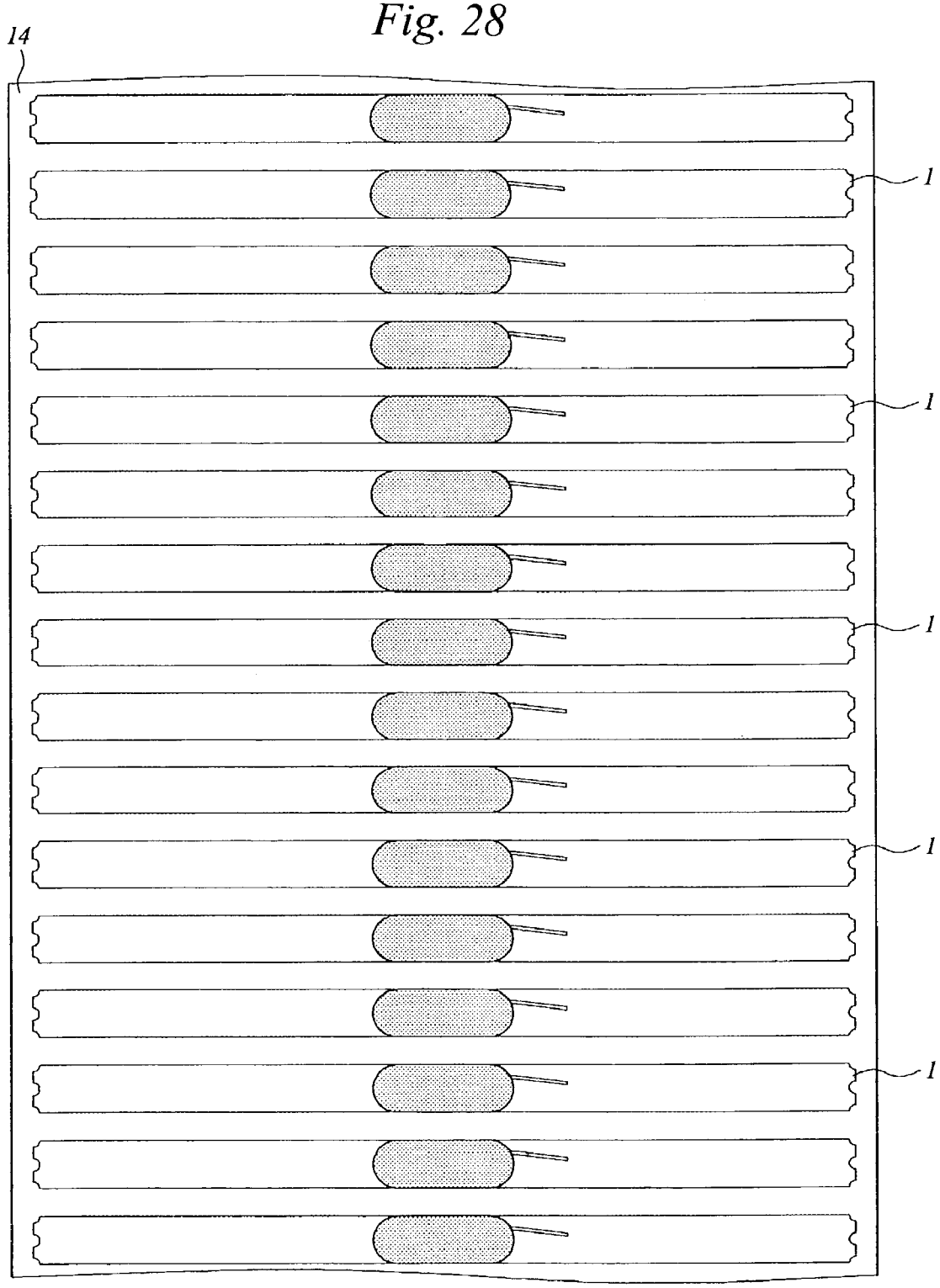
FIG. 28 is a plan view showing the principal part in the manufacturing method of the electronic tag according to another embodiment of the present invention.

Subsequently, the electronic tags 1 separated from the lead frame 20 are checked one by one in order to sort the good from the bad. Thereafter, the good electronic tags 1 are arranged and adhered onto the entire surface of the double-faced adhesive tape 14 as shown in FIG. 28. The length of the double-faced adhesive tape 14 is appropriately adjusted depending on the number of the electronic tags 1 to be adhered.

Figure 29:
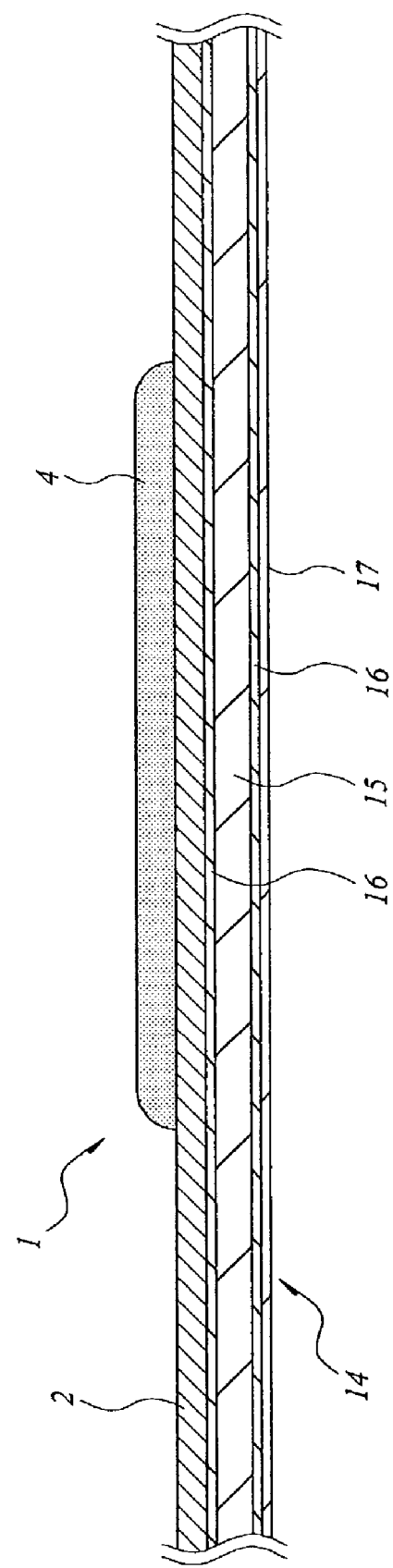
FIG. 29 is a sectional view showing the principal part in the manufacturing method of the electronic tag according to another embodiment of the present invention.

As shown in FIG. 29, the double-faced adhesive tape 14 has a structure in which adhesives 16 and 16 are applied to both surfaces of an insulating tape 15. In addition, a cover tape 17 is adhered to the rear surface of the double-faced adhesive tape 14 so as to prevent the adhesion of the electronic tag 1 to another double-faced adhesive tape 14 when packaging the tape 14 in piles.

Figure 30:
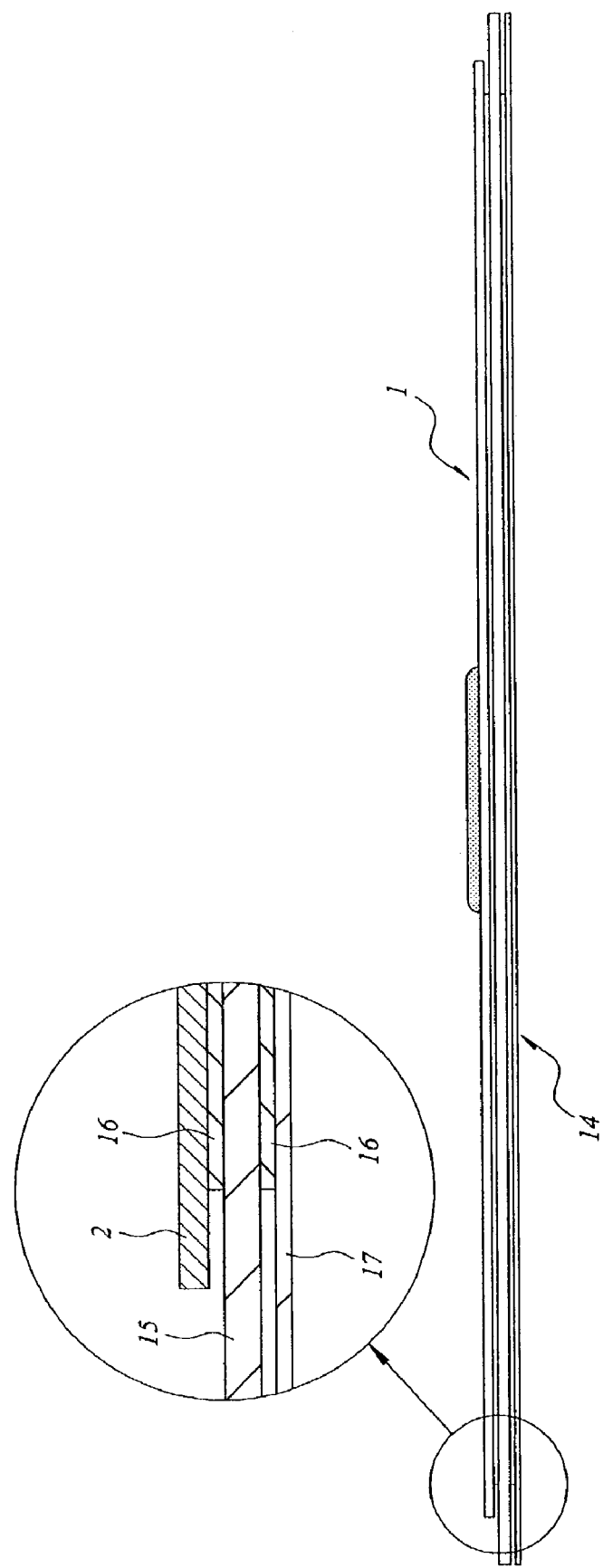
FIG. 30 is a side view showing the manufacturing method of the electronic tag according to another embodiment of the present invention.
Figure 31:
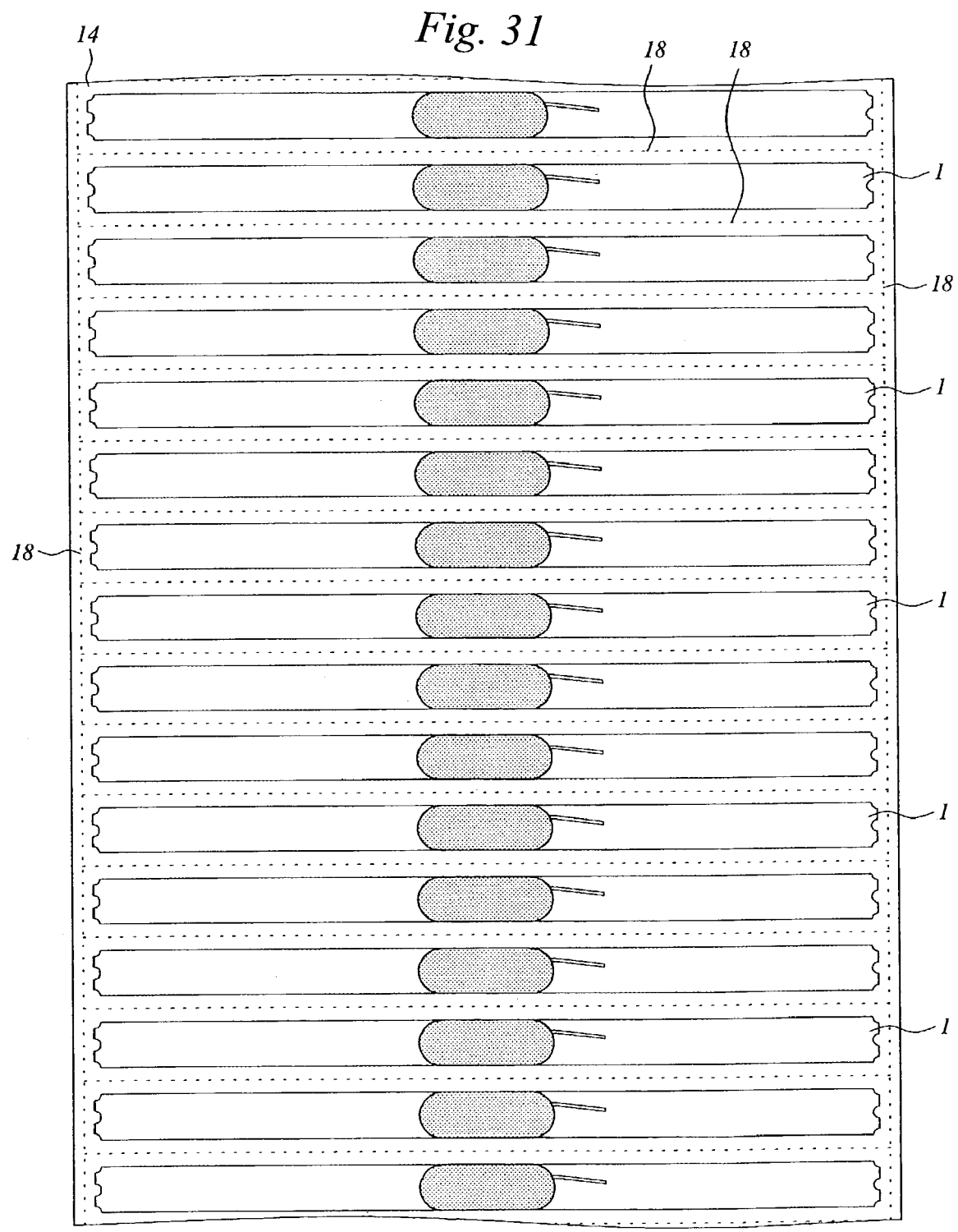
FIG. 31 is a plan view showing the principal part in the manufacturing method of the electronic tag according to another embodiment of the present invention.

It is preferable that the surface areas of the adhesives 16 and 16 applied to both surfaces of the insulating tape 15 are made smaller than that of the electronic tag 1 as shown in FIG. 30. By so doing, the cover tape 17 can be easily peeled when adhering the electronic tag 1 to the surfaces of the various kinds of articles like those shown in FIGS. 22 to 27 by the use of the double-faced adhesive tape 14, and also, the adhesive 16 does not overflow to the outside of the electronic tag 1 adhered to the article. Also, the separation into pieces of the electronic tags 1 can be facilitated by the perforation 18 provided to the double-faced adhesive tape 14 as shown in FIG. 31.

Figure 32:
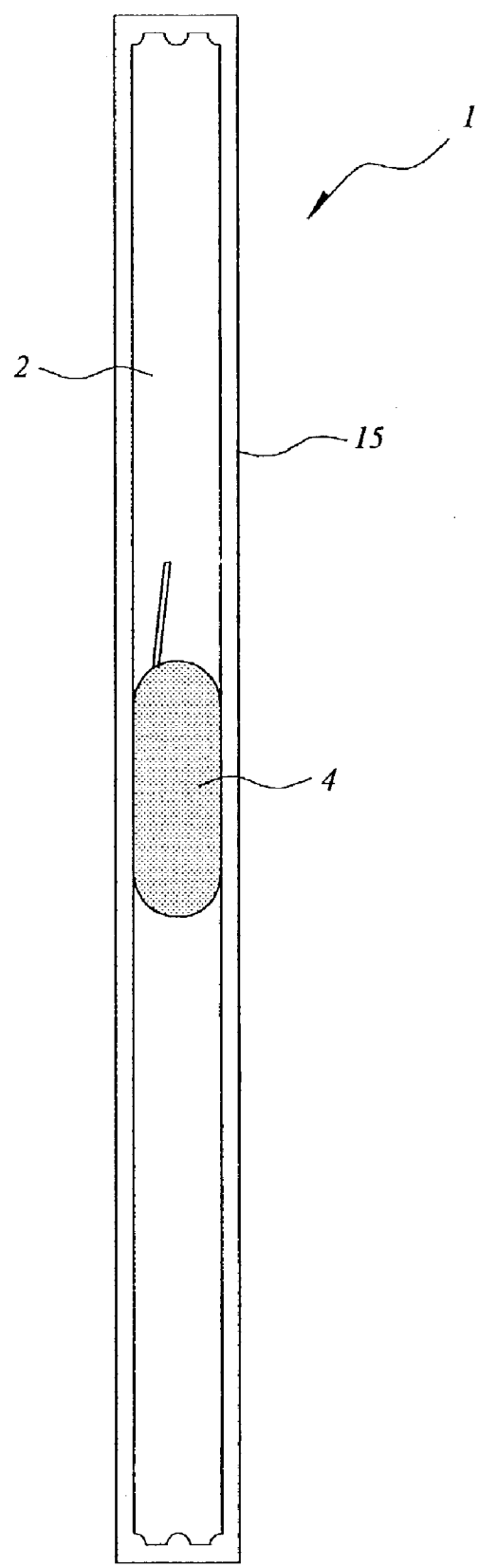
FIG. 32 is a plan view showing the electronic tag according to another embodiment of the present invention.
Figure 33:
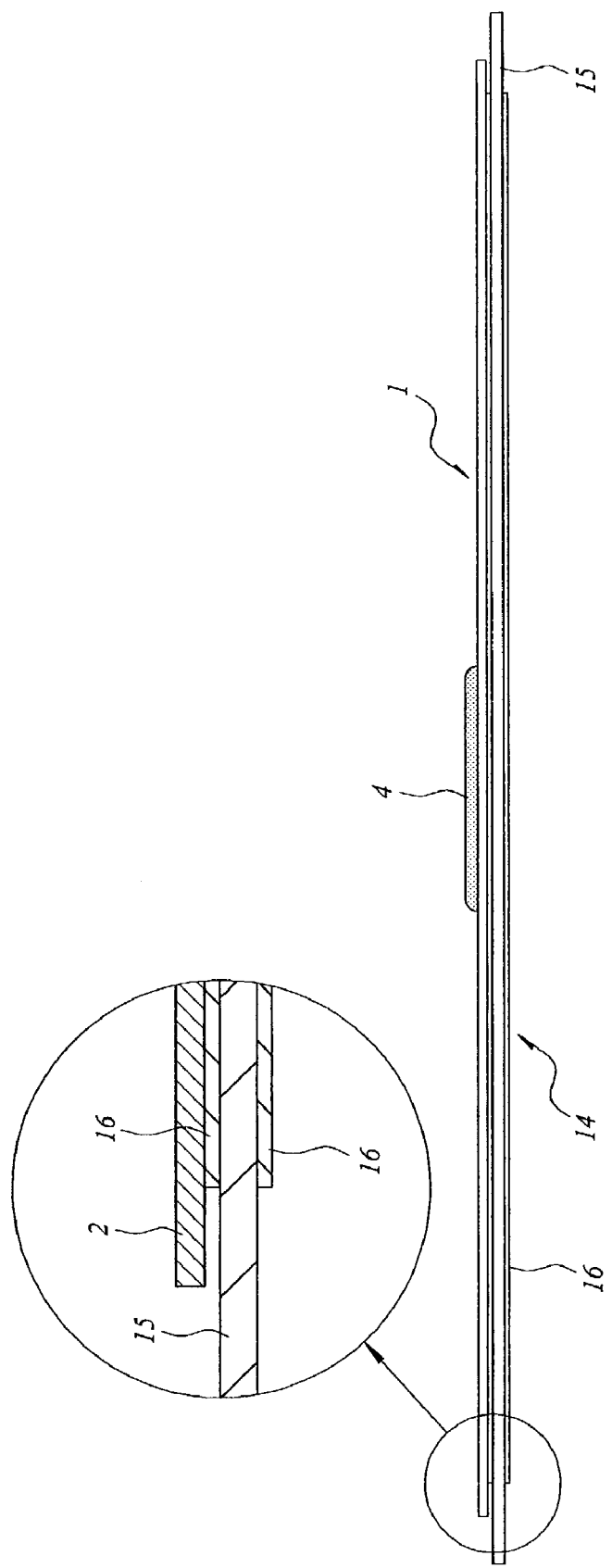
FIG. 33 is a side view showing the electronic tag in the state where a cover tape thereof is peeled according to another embodiment of the present invention.

FIG. 32 is a plan view showing a piece of the electronic tag 1 obtained by cutting the double-faced adhesive tape 14, and FIG. 33 is a side view of the electronic tag 1 whose cover tape 17 has been peeled off.

By using the double-faced adhesive tape 14 having the surface area of the adhesive 16 smaller than that of the electronic tag 1, the overflow of the adhesive 16 to the outside of the separated electronic tag 1 can be prevented, and the adhesion of the electronic tag 1 to a fixture can be prevented in the process of adhering the electronic tag 1. In addition, since the profile of the insulating tape 15 is designed to be larger than that of the electronic tag 1, the insulating tape 15 protruded around the electronic tag 1 can protect the electronic tag 1.

Figure 34:
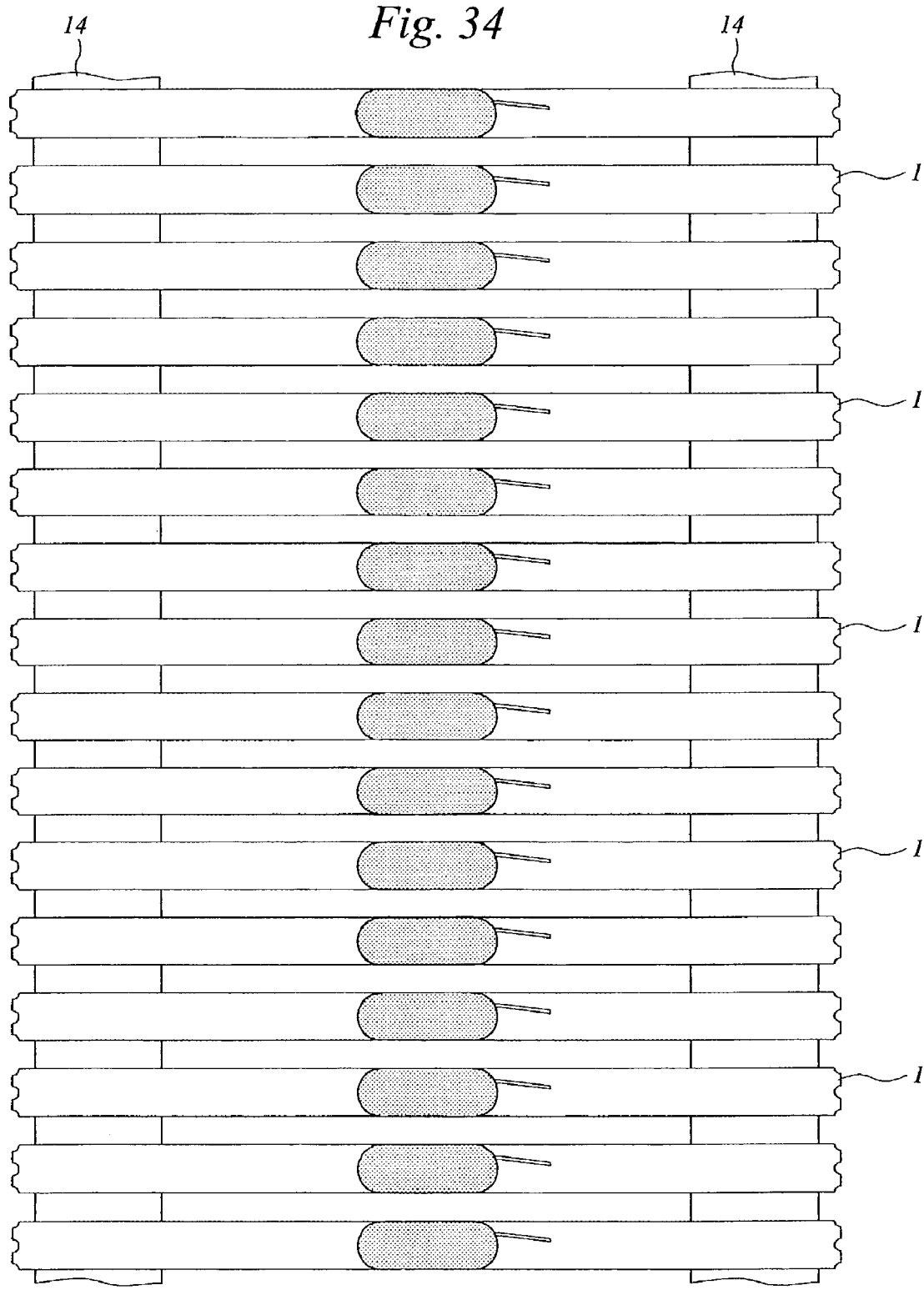
FIG. 34 is a plan view showing the principal part in the manufacturing method of the electronic tag according to another embodiment of the present invention.
Figure 35:
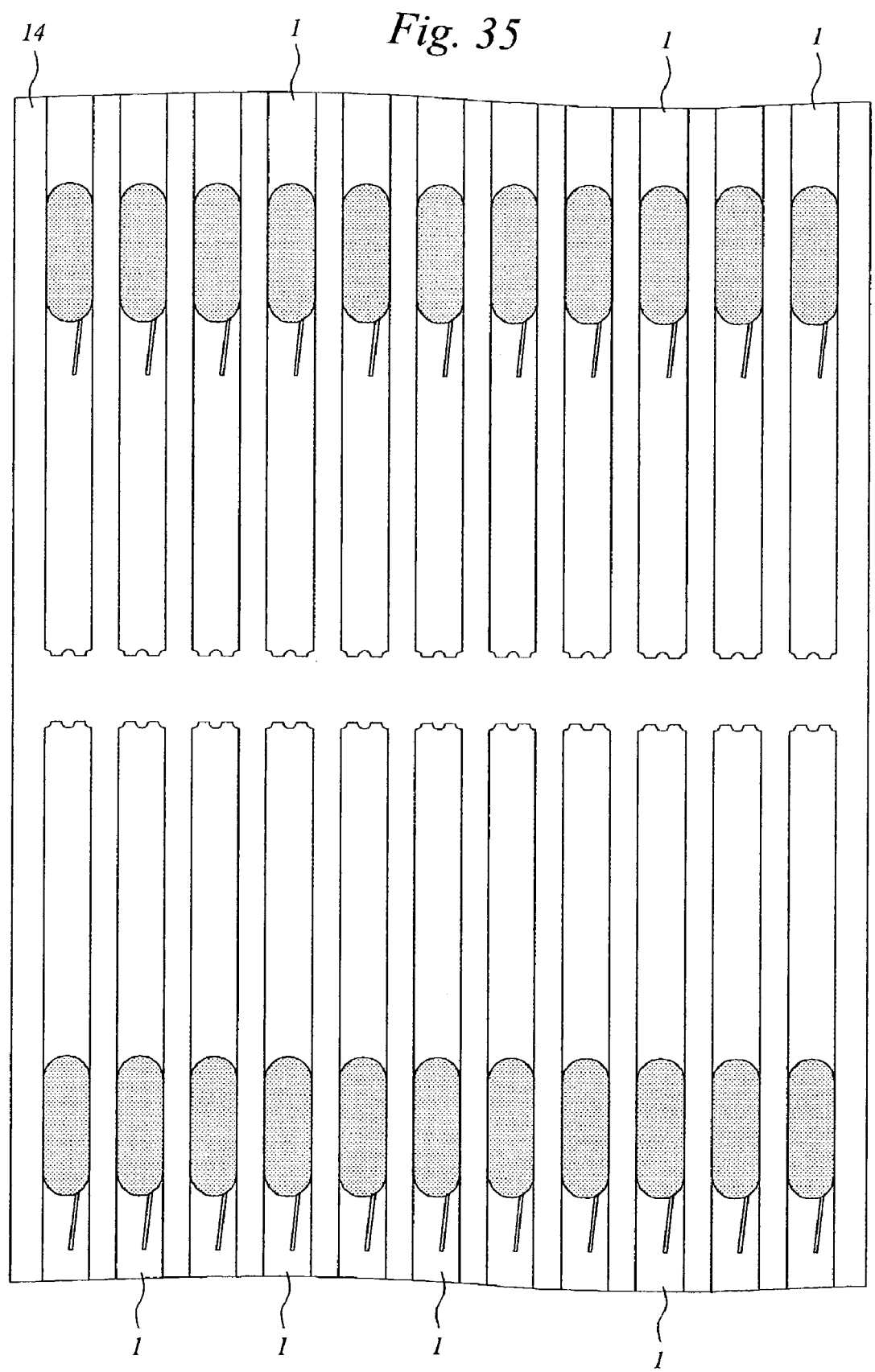
FIG. 35 is a plan view showing the principal part in the manufacturing method of the electronic tag according to another embodiment of the present invention.

It is also preferable to design the double-faced adhesive tape 14 to have a width narrower than the length of the electronic tag 1 as shown in FIG. 34. Also, the arrangement of the electronic tags 1 on the double-faced adhesive tape 14 like that shown in FIG. 35 is also available in which the longitudinal direction of the electronic tags 1 and that of the double-faced adhesive tape 14 are parallel to each other. In this case, however, care should be given so as not to deform the lead 2 of the electronic tag 1 when the double-faced adhesive tape 14 is folded into the package.

Figure 36:
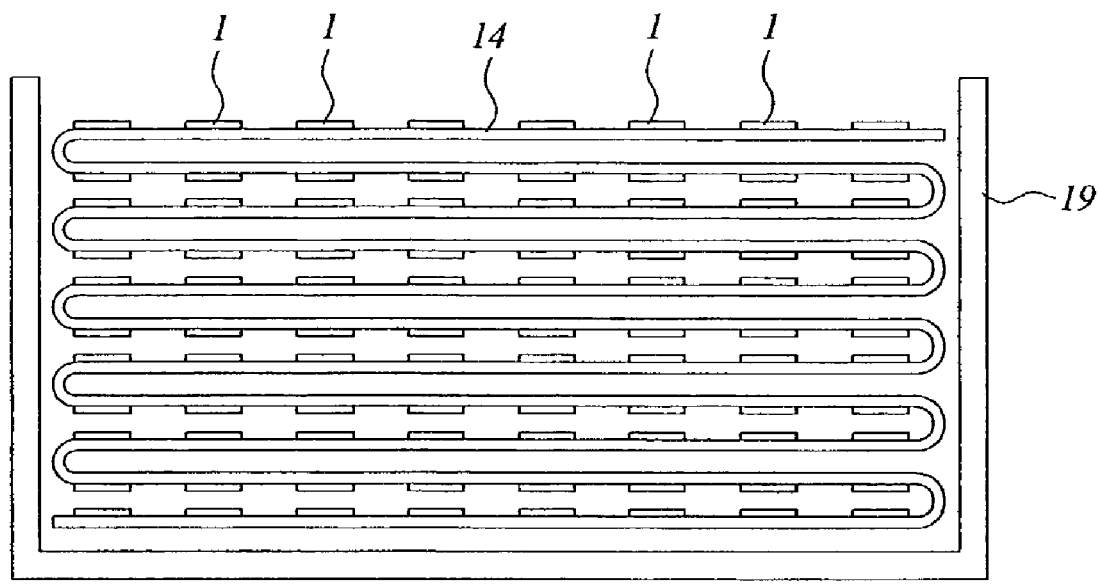
FIG. 36 is an explanatory drawing for a method of packaging the electronic tag according to another embodiment of the present invention.
Figure 37:
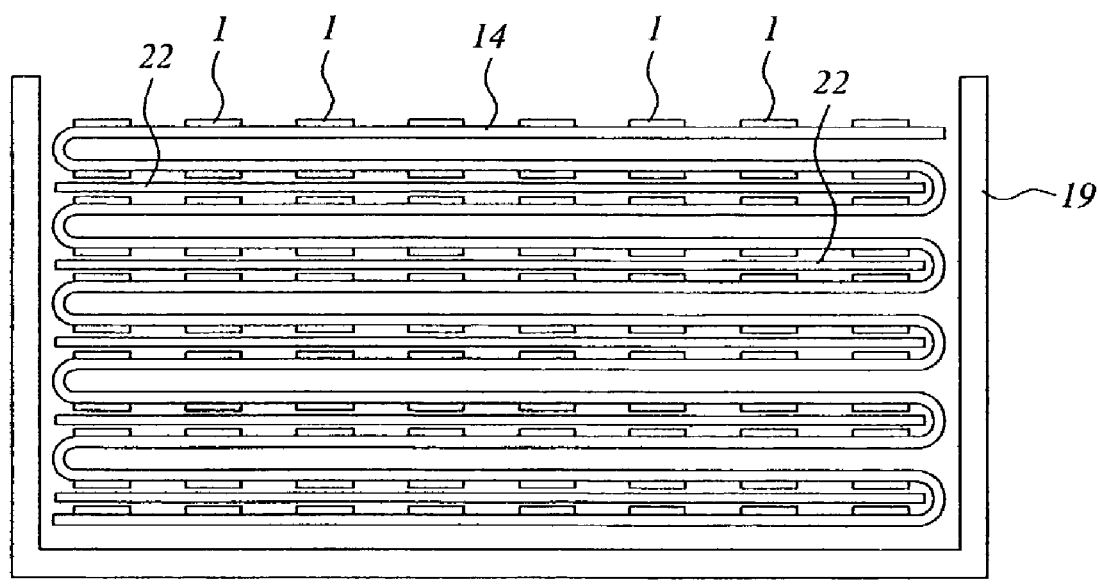
FIG. 37 is an explanatory drawing for the method of packaging the electronic tag according to another embodiment of the present invention.

In the event of the shipment of the electronic tag 1 from the manufacturer to the customer, a number of the electronic tags 1 required by the customer are adhered to the double-faced adhesive tape 14 and the double-faced adhesive tape 14 is folded in a zigzag fashion and contained in a case 19 as shown in FIG. 36, then shipped to the customer. In this case, it is preferable to interpose an interlayer sheet 22 between the double-faced adhesive tapes 14 as shown in FIG. 37 so as to prevent the damage of the electronic tag 1.

Figure 38:
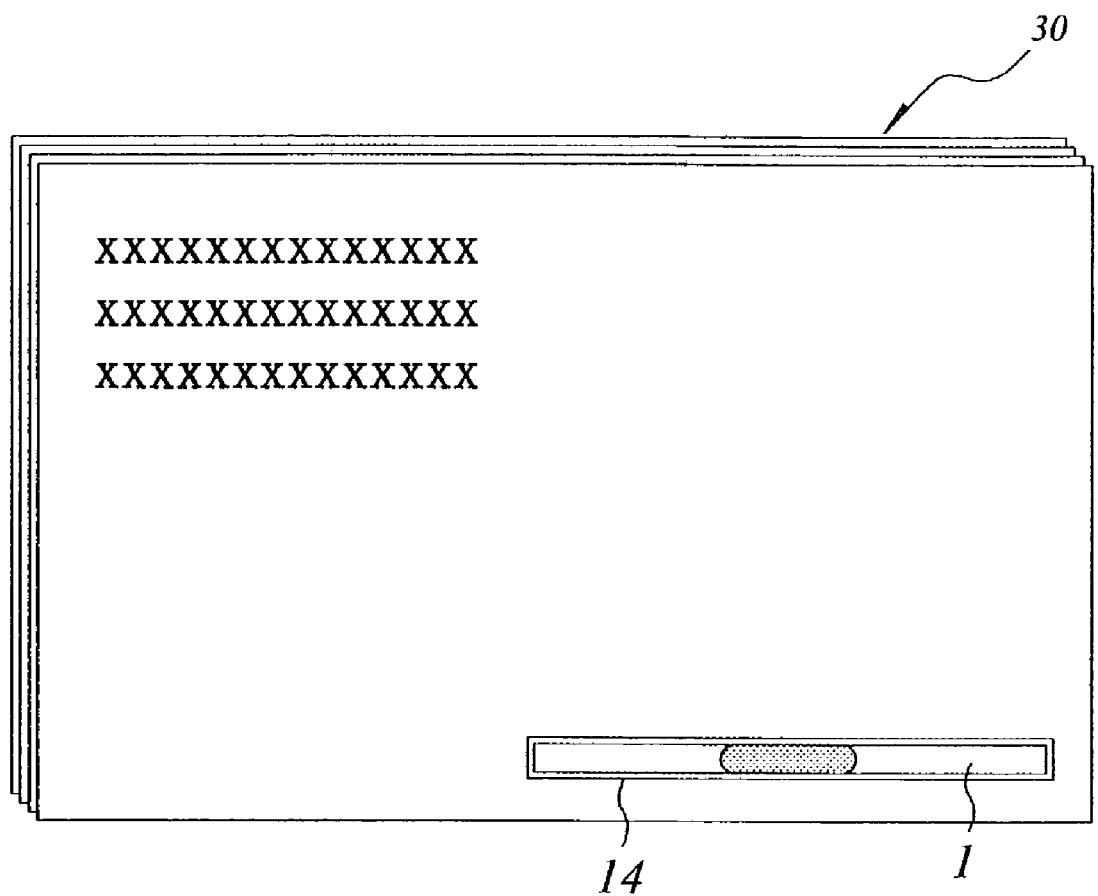
FIG. 38 is an explanatory drawing for a method of using the electronic tag according to the present invention.

The electronic tag 1 is adhered to an article in the following manner. That is, after the double-faced adhesive tape 14 is cut to obtain a piece of the electronic tag 1, the cover tape 17 on the rear surface of the double-faced adhesive tape 14 is peeled, and then, the electronic tag 1 is adhered to the article. FIG. 38 illustrates an example in which the electronic tag 1 is adhered to the surface of the slip 30 by the use of the double-faced adhesive tape 14.

In the above-described first embodiment, the electronic tag 1 is fabricated with using the rectangular lead frame 20. However, a long lead frame to be wound on a reel can be used to manufacture the electronic tag 1.

In this case, a semiconductor chip is first mounted on each lead in the lead frame and the lead and the semiconductor chip are electrically connected to each other. Thereafter, the semiconductor chip mounted on each lead is sealed with molding resin or potting resin, thereby manufacturing an electronic tag. These processes are almost identical to those in the first embodiment. However, the difference is that the lead frame is conveyed between the processes while being wound on a reel.

Next, after adhering the lead frame onto the entire surface of a double-faced adhesive tape, the support frame of the lead frame is cut off and removed. By so doing, the electronic tags adhered to the double-faced adhesive tape are electrically isolated from each other. Next, the electronic tags in this state are checked to sort the good from the bad, and then, only the defective electronic tags are peeled off from the double-faced adhesive tape and then removed.

Figure 39:
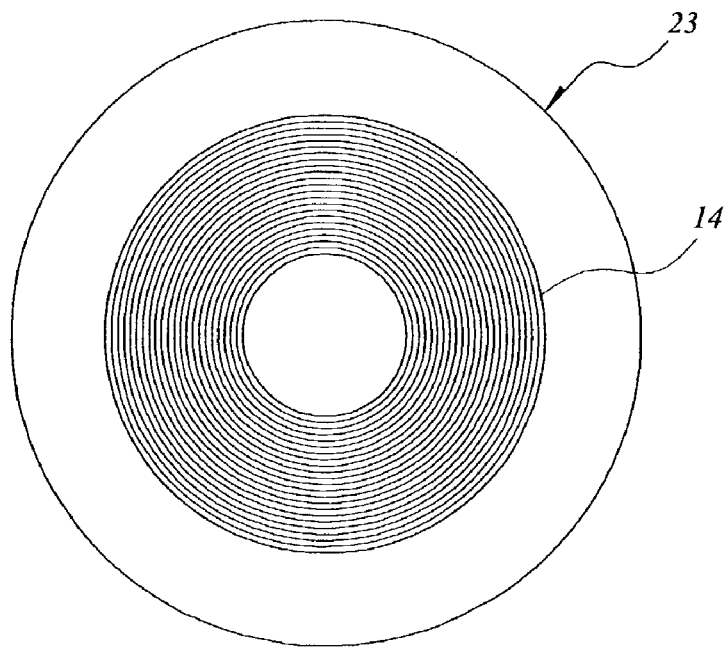
FIG. 39 is an explanatory drawing for a method of packaging the electronic tag according to another embodiment of the present invention.
Figure 40:
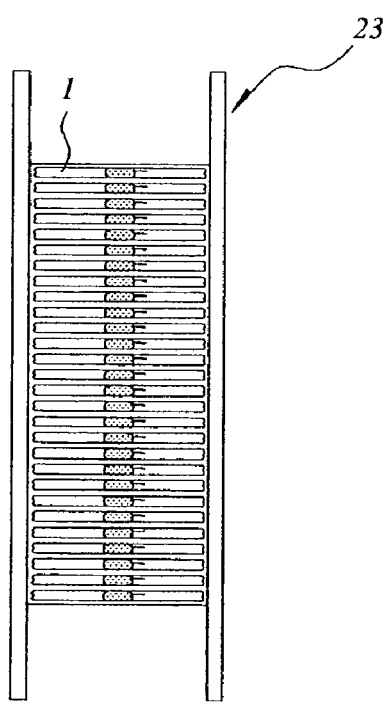
FIG. 40 is an explanatory drawing for the method of packaging the electronic tag according to another embodiment of the present invention.

Subsequently, as shown in FIGS. 39 and 40, the double-faced adhesive tape 14 to which the good electronic tags 1 are adhered is wound on a reel 23. Thereafter, the reel 23 is contained in a case or the like, then shipped to the customer.

As described above, in this embodiment, the processes from the manufacture of the electronic tag 1 to the shipment thereof can be performed through the consistent production. In addition, when adhering the electronic tag 1 to the article, the process of applying adhesive to the rear surface of the electronic tag 1 is unnecessary in the customer's side. Therefore, the simplification and automation of the adhesion of the electronic tag 1 can be achieved.

In the foregoing, the inventions made by the inventors thereof have been described in detail based on the embodiments. However, it goes without saying that the present invention is not limited to the embodiments, and various changes and modifications can be made within the scope of the present invention.

The advantages achieved by the typical ones of the invention disclosed in this application will be briefly described as follows.

According to an aspect of the present invention, the processes from the manufacture of the electronic tag to the shipment thereof can be performed through the consistent production. In addition, it is possible to improve the efficiency in the process of adhering the electronic tag to an article.

What is claimed is:

1. A method of manufacturing an electronic tag, comprising a first step of adhering a plurality of electronic tags to a surface of a double-faced adhesive tape, each electronic tag being provided with a rectangular lead constituting an antenna; a slit formed in a part of the lead and having an end extending to an outer edge of the lead; a semiconductor chip mounted on the lead near the slit; a wire having one end bonded to an electrode of the semiconductor chip and the other end bonded to an area of the lead facing to a semiconductor chip-mounting area across the slit; and resin for sealing the semiconductor chip and the wire; and a second step of packaging the double-faced adhesive tape to which the electronic tags are adhered, and then shipping the same.

2. The method of manufacturing an electronic tag according to claim 1,
wherein a surface area of the adhesive applied to the double-faced adhesive tape is made smaller than that of the conductor piece.

3. The method of manufacturing an electronic tag according to claim 1,
wherein perforations are provided to the double-faced adhesive tape around respective areas to which electronic tags are adhered.

4. The method of manufacturing an electronic tag according to claim 1,
wherein, when adhering the electronic tags to the double-faced adhesive tape, the electronic tags are oriented so that the longitudinal direction of the leads and that of the double-faced adhesive tape are parallel to each other.

5. The method of manufacturing an electronic tag according to claim 1,
wherein the double-faced adhesive tape to which the electronic tags are adhered is folded in a zigzag fashion and then shipped.

6. The method of manufacturing an electronic tag according to claim 1,
wherein the double-faced adhesive tape to which the electronic tags are adhered is wound on a reel and then shipped.

7. The method of manufacturing an electronic tag according to claim 1, in combination with the following additional steps:
a third step of separating a portion of the double-faced adhesive tape to obtain a piece including an electronic tag from the plurality of electronic tags; and
a fourth step of attaching the electronic tag to an article by adhering the double-faced adhesive tape of the piece obtained in the third step to the article.

8. A method of manufacturing an electronic tag, which is provided with a rectangular lead constituting an antenna; a slit formed in a part of the lead and having an end extending to an outer edge of the lead; a semiconductor chip mounted on the lead near the slit; a wire having one end bonded to an electrode of the semiconductor chip and the other end bonded to an area of the lead facing to a semiconductor chip-mounting area across the slit; and resin for sealing the semiconductor chip and the wire,
the method comprising the steps of:
(a) preparing a lead frame in which a plurality of leads are arranged in parallel to each other, and both longitudinal ends of the leads are held by a pair of support frames extending in a direction perpendicular to the longitudinal direction of the leads;
(b) mounting a semiconductor chip on each lead;
(c) connecting the lead and the semiconductor chip with a wire;
(d) sealing the semiconductor chip and the wire with resin; and
(e) cutting both ends of the respective leads to separate the leads from the support frames.

9. The method of manufacturing an electronic tag according to claim 8,
wherein no support frame extending in the longitudinal direction of the leads is provided between the respective leads.

10. A method of manufacturing an electronic tag, the electronic tag being provided with a rectangular lead constituting an antenna; a slit formed in a part of the lead and having an end extending to an outer edge of the lead; a semiconductor chip mounted on the lead near the slit; a wire having one end bonded to an electrode of the semiconductor chip and the other end bonded to an area of the lead facing to a semiconductor chip-mounting area across the slit; and resin for sealing the semiconductor chip and the wire, comprising the steps of:
  (a) preparing a lead frame to which a plurality of the leads each constituting an antenna of an electronic tag are connected via support frames;
  (b) mounting a semiconductor chip on each lead of the lead frame, and then electrically connecting the lead to the semiconductor chip;
  (c) sealing the semiconductor chips mounted on the leads with resin, thereby producing a plurality of electronic tags;
  (d) after the step (c), adhering the lead frame having the plurality of electronic tags to a surface of a double-faced adhesive tape;
  (e) after the step (d), cutting the support frames of the lead frame to remove the same;
  (f) checking the quality of the electronic tags, which are adhered to the surface of the double-faced adhesive tape and electrically isolated from each other; and
  (g) after the step (f), packaging the double-faced adhesive tape to which the electronic tags are adhered, and then shipping the same.

11. The method of manufacturing an electronic tag according to claim 10,
wherein the double-faced adhesive tape to which the electronic tags are adhered is folded in a zigzag fashion and then shipped.

12. The method of manufacturing an electronic tag according to claim 10,
wherein the double-faced adhesive tape to which the electronic tags are adhered is wound on a reel and then shipped.

13. The method of manufacturing an electronic tag according to claim 10, in combination with the following additional steps:
  (h) after the step (g), separating a portion of the double-faced adhesive tape to obtain a piece including an electronic tag from the plurality of electronic tags; and
  (i) after the step (h), attaching the electronic tag to an article by adhering the double-faced adhesive tape of the piece obtained in step (h) to the article.

14. A method of manufacturing an electronic tag, the electronic tag being provided with a rectangular lead constituting an antenna; a slit formed in a part of the lead and having an end extending to an outer edge of the lead; a semiconductor chip mounted on the lead near the slit; a wire having one end bonded to an electrode of the semiconductor chip and the other end bonded to an area of the lead facing to a semiconductor chip-mounting area across the slit; and resin for sealing the semiconductor chip and the wire, comprising the steps of:
  (a) preparing a lead frame to which a plurality of the leads each constituting an antenna of an electronic tag are connected via support frames;
  (b) mounting a semiconductor chip on each lead of the lead frame, and then electrically connecting the lead to the semiconductor chip;
  (c) sealing the semiconductor chips mounted on the leads with resin, thereby producing electronic tags;
  (d) after the step (c), cutting the support frames of the lead frame to remove the same, thereby separating the electronic tags from the support frames;
  (e) checking quality of the electronic tags;
  (f) after the step (e), adhering a plurality of the electronic tags to a surface of a double-faced adhesive tape; and
  (g) packaging the double-faced adhesive tape to which the plurality of electronic tags are adhered, and then shipping the same.

15. The method of manufacturing an electronic tag according to claim 14,
wherein the double-faced adhesive tape to which the electronic tags are adhered is folded in a zigzag fashion and then shipped.

16. The method of manufacturing an electronic tag according to claim 14,
wherein the double-faced adhesive tape to which the electronic tags are adhered is wound on a reel and then shipped.

17. The method of manufacturing an electronic tag according to claim 14, in combination with the following additional steps:
  (h) after the step (g), separating a portion of the double-faced adhesive tape to obtain a piece including an electronic tag from the plurality of electronic tags; and
  (i) after the step (h), attaching the electronic tag to an article by adhering the double-faced adhesive tape of the piece obtained in step (h) to the article.

18. A method comprising the steps of:
providing a double-faced adhesive tape having a plurality of electronic tags disposed over substantially an entire surface thereof, each electronic tag being provided with a rectangular lead constituting an antenna; a slit formed in a part of the lead and having an end extending to an outer edge of the lead; a semiconductor chip mounted on the lead near the slit; a wire having one end bonded to an electrode of the semiconductor chip and the other end bonded to an area of the lead facing to a semiconductor chip-mounting area across the slit; and resin for sealing the semiconductor chip and the wire; and
separating a portion of the double-faced adhesive tape to obtain a piece including an electronic tag from the plurality of electronic tags.

19. A method according to claim 18, further comprising attaching the electronic tag to an article by adhering the double-faced adhesive tape of the obtained piece to the article.

* * * * *